US012738714B2

(12) United States Patent
Nakajima et al.

(10) Patent No.: US 12,738,714 B2
(45) Date of Patent: Sep. 15, 2026

(54) VERTICAL CAVITY SURFACE EMITTING LASER DEVICE AND METHOD OF PRODUCING A VERTICAL CAVITY SURFACE EMITTING LASER DEVICE

(71) Applicant: SONY GROUP CORPORATION, Tokyo (JP)

(72) Inventors: Hiroshi Nakajima, Tokyo (JP); Mikihiro Yokozeki, Tokyo (JP); Tomomasa Watanabe, Tokyo (JP); Daiji Kasahara, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 688 days.

(21) Appl. No.: 18/250,432

(22) PCT Filed: Oct. 25, 2021

(86) PCT No.: PCT/JP2021/039221

§ 371 (c)(1),
(2) Date: Apr. 25, 2023

(87) PCT Pub. No.: WO2022/097513

PCT Pub. Date: May 12, 2022

(65) Prior Publication Data

US 2024/0006851 A1 Jan. 4, 2024

(30) Foreign Application Priority Data

Nov. 4, 2020 (JP) ................................ 2020-184529

(51) Int. Cl.
*H01S 5/183* (2006.01)
*H01S 5/042* (2006.01)
(Continued)

(52) U.S. Cl.
CPC ...... *H01S 5/18311* (2013.01); *H01S 5/04256* (2019.08); *H01S 5/187* (2013.01); *H01S 5/3095* (2013.01)

(58) Field of Classification Search
CPC .................................................... H01S 5/3095
See application file for complete search history.

(56) References Cited

U.S. PATENT DOCUMENTS

2004/0076209 A1* 4/2004 Bour .................. H01S 5/18366 372/45.01
2006/0227835 A1* 10/2006 Ueki .................. H01S 5/18341 372/50.124

(Continued)

FOREIGN PATENT DOCUMENTS

CN 1717850 A * 1/2006 ......... H01S 5/04254
EP 1418631 A2 5/2004

(Continued)

OTHER PUBLICATIONS

English translation of Jikutani (Year: 2005).*

(Continued)

*Primary Examiner* — Minsun O Harvey
*Assistant Examiner* — Stephen Sutton Kotter
(74) *Attorney, Agent, or Firm* — CHIP LAW GROUP

(57) ABSTRACT

Provided is a vertical cavity surface emitting laser device including a first reflection mirror, a second reflection mirror, a first semiconductor layer, a second semiconductor layer, a tunnel junction layer, and a light-emitting layer, the vertical cavity surface emitting laser device having a mesa structure (M) that has a current injection region where a current passing through an inner peripheral region and flowing into the light-emitting layer concentrates. The tunnel junction layer is between the first reflection mirror and the second reflection mirror, a highly doped layer of a first conductivity type and a highly doped layer of a second conductivity type (Continued)

being joined together in the tunnel junction layer, the tunnel junction layer having an inner peripheral region and an outer peripheral region surrounding the inner peripheral region, the inner peripheral region including a material containing Al, the outer peripheral region including a material containing an Al oxide.

15 Claims, 27 Drawing Sheets

(51) Int. Cl.
*H01S 5/187* (2006.01)
*H01S 5/30* (2006.01)

(56) References Cited

U.S. PATENT DOCUMENTS

2015/0146275 A1* 5/2015 Lee .................... G02F 1/01716 359/245
2021/0104872 A1* 4/2021 Huang ................ H01S 5/18358
2022/0239068 A1* 7/2022 Kearns ................ H01S 5/18341
2023/0047126 A1* 2/2023 Arakida .............. H01S 5/18305

FOREIGN PATENT DOCUMENTS

EP 4207515 A1 7/2023
JP 2003-324251 A 11/2003
JP 2005044964 A * 2/2005

OTHER PUBLICATIONS

English translation of Amann (Year: 2006).*
https://web.archive.org/web/20150224013107/https://www.vocabulary.com/dictionary/gap (Year: 2015).*
International Search Report and Written Opinion of PCT Application No. PCT/JP2021/039221, issued on Nov. 30, 2021, 11 pages of ISRWO.

* cited by examiner

VERTICAL CAVITY SURFACE EMITTING LASER DEVICE AND METHOD OF PRODUCING A VERTICAL CAVITY SURFACE EMITTING LASER DEVICE

CROSS REFERENCE TO RELATED APPLICATIONS

This application is a U.S. National Phase of International Patent Application No. PCT/JP2021/039221 filed on Oct. 25, 2021, which claims priority benefit of Japanese Patent Application No. JP 2020-184529 filed in the Japan Patent Office on Nov. 4, 2020. Each of the above-referenced applications is hereby incorporated herein by reference in its entirety.

TECHNICAL FIELD

The present technology relates to a vertical cavity surface emitting laser device that emits a laser beam in a direction perpendicular to a layer surface, and a method of producing the vertical cavity surface emitting laser device.

BACKGROUND ART

A VCSEL (Vertical Cavity Surface Emitting Laser) device has a structure in which a light-emitting layer is sandwiched between a pair of reflection mirrors. A current confinement structure is provided in the vicinity of the light-emitting layer, and a current concentrates in a partial region in the light-emitting layer by the current confinement structure to generate spontaneous emission light. The pair of reflection mirrors reflects light of a predetermined wavelength, of the spontaneous emission light, toward the light-emitting layer, thereby causing laser oscillation.

In recent years, infrared emission VCSEL of a 940 nm band has been used as a light source of a three-dimensional sensing system such as face authentication. Although it is effective to increase the light output of the light source in order to increase the authentication accuracy, it is desired to set the light output to a predetermined value or less in order to prevent eyes from being damaged due to the laser beam.

This value is called a damage threshold value and increases as the wavelength of the laser beam is higher. Since the damage threshold value significantly increases from the wavelength of 1.4 μm or more, the wavelength band of 1.4 μm or more is called an eye-safe band. Further, the wavelength band of 1.4 μm is suitable for outdoor use because noise due to sunlight is small. For this reason, a laser light source of the wavelength band of 1.4 μm is desired as a light source for next-generation sensing. Further, as a structure of a laser beam used for sensing, a VCSEL that is cheaper than an existing edge emitting laser and can be easily arrayed is favorable.

There is an InP substrate as a substrate suitable for a laser beam that oscillates at the wavelength of 1.4 μm. However, it is not easy to form a current confinement structure on the InP substrate. This is because an excellent oxidized confinement layer such as an AlAs oxidized layer that can be used in a GaAs substrate cannot be used in the InP substrate due to lattice-matching problems. For this reason, a buried tunnel junction is generally used for the current confinement structure.

Further, there is also a method of using an AlInAs layer that can be lattice-matched with an InP substrate in order to form a current confinement structure. However, the oxidation rate of AlInAs is proportional to the Al composition and decreases as the Al composition is lower. Since the Al composition of AlInAs that can be lattice-matched with the InP substrate is low, it is necessary to oxidize at a high temperature in order to achieve a realistic oxidation rate, which inevitably leads to crystal deterioration. To address this problem, Patent Literature 1 disclose a current confinement structure that includes an AlInAs oxidized layer including a superlattice of InAs and AlAs.

CITATION LIST

Patent Literature

Patent Literature 1: Japanese Patent Application Laid-open No. 2006-294811

DISCLOSURE OF INVENTION

Technical Problem

However, the current confinement structure using a buried tunnel junction as described above requires crystal regrowth to form a buried tunnel junction, which causes a problem of production cost. Further, in the current confinement structure using an AlInAs oxidized layer as described in Patent Literature 1, it is necessary to form a superlattice of InAs and AlAs using a molecular beam epitaxy method or the like, which causes a problem of producibility.

In view of the circumstances as described above, it is an object of the present technology to provide a vertical cavity surface emitting laser device that is excellent in producibility and capable of reducing the production cost and a method of producing the vertical cavity surface emitting laser device.

Solution to Problem

In order to achieve the above-mentioned object, a vertical cavity surface emitting laser device according to an embodiment of the present technology includes: a first reflection mirror; a second reflection mirror; a first semiconductor layer; a second semiconductor layer; a tunnel junction layer; and a light-emitting layer, the vertical cavity surface emitting laser device having a mesa structure that has a current injection region where a current passing through an inner peripheral region and flowing into the light-emitting layer concentrates.

The first reflection mirror reflects light of a specific wavelength.

The second reflection mirror reflects light of the wavelength.

The first semiconductor layer is disposed between the first reflection mirror and the second reflection mirror and is formed of a semiconductor material having a first conductivity type.

The second semiconductor layer is disposed between the first reflection mirror and the second reflection mirror and is formed of a semiconductor material having a second conductivity type.

The tunnel junction layer is disposed between the first reflection mirror and the second reflection mirror, a highly doped layer of the first conductivity type and a highly doped layer of the second conductivity type being joined together in the tunnel junction layer, the tunnel junction layer having an inner peripheral region on an inner peripheral side when viewed from a direction perpendicular to a layer surface and an outer peripheral region surrounding the inner peripheral region, the inner peripheral region being formed of a material containing Al, the outer peripheral region being formed of a material containing an Al oxide.

The light-emitting layer is disposed between the first reflection mirror and the second reflection mirror and emits light by carrier recombination.

In accordance with this configuration, since the outer peripheral region of the tunnel junction layer is insulating, a current passes through the inner peripheral region, i.e., a current confinement structure can be realized by the tunnel junction layer.

The tunnel junction layer may have an end surface that is an outer peripheral surface along the direction of the outer peripheral region, the mesa structure may have a side surface that is an outer peripheral surface along the direction, and the end surface may be located on a side of the inner peripheral region than the side surface and may be spaced apart from the side surface.

A gap may be provided between the end surface and the side surface.

A space between the end surface and the side surface may be filled with an insulator.

The inner peripheral region may be formed of AlInAs, and the outer peripheral region may be formed of an oxide of AlInAs.

The light-emitting layer may have a multiple quantum well structure formed of AlGaInAs.

The tunnel junction layer may have an end surface that is an outer peripheral surface along the direction of the outer peripheral region, the mesa structure may have a side surface that is an outer peripheral surface along the direction, and the end surface may be located on the same surface as the side surface.

The inner peripheral region may be formed of AlAs, and the outer peripheral region may be formed of an AlAs oxide.

The light-emitting layer may have a multiple quantum well structure formed of AlGaAs and GaInAs.

At least one of the first reflection mirror or the second reflection mirror may be formed of a dielectric.

Both the first reflection mirror and the second reflection mirror may be formed of a dielectric.

At least one of the first reflection mirror or the second reflection mirror may have a lens shape that collects light on the current injection region.

In order to achieve the above-mentioned object, a method of producing a vertical cavity surface emitting laser device according to an embodiment of the present technology includes: preparing a stacked body that includes a first semiconductor layer formed of a semiconductor material having a first conductivity type, a second semiconductor layer formed of a semiconductor material having a second conductivity type, a tunnel junction layer formed of a material containing Al, a highly doped layer of the first conductivity type and a highly doped layer of the second conductivity type being joined together in the tunnel junction layer, and a light-emitting layer that emits light by carrier recombination.

A mesa structure having a current injection region where a current flowing into the light-emitting layer concentrates is formed.

The tunnel junction layer is selectively oxidized from a side of an outer periphery of the mesa structure to form, in the tunnel junction layer, an inner peripheral region on an inner peripheral side and an outer peripheral region surrounding the inner peripheral region, the inner peripheral region being formed of a material containing Al, the outer peripheral region being formed of a material containing an Al oxide.

The method of producing a vertical cavity surface emitting laser device may further include, after the step of forming the mesa structure and before the step of oxidizing the tunnel junction layer, a step of removing part of the tunnel junction layer from a side of an outer periphery of the tunnel junction layer to cause an end surface of the tunnel junction layer to be spaced apart from a side surface of the mesa structure.

The step of removing part of the tunnel junction layer may be a wet etching step using an etchant for selectively etching the tunnel junction layer.

MODE(S) FOR CARRYING OUT THE INVENTION

First Embodiment

A VCSEL (Vertical Cavity Surface Emitting Laser) device according to a first embodiment of the present technology will be described.

[Structure of VCSEL Device]

Figure 1:
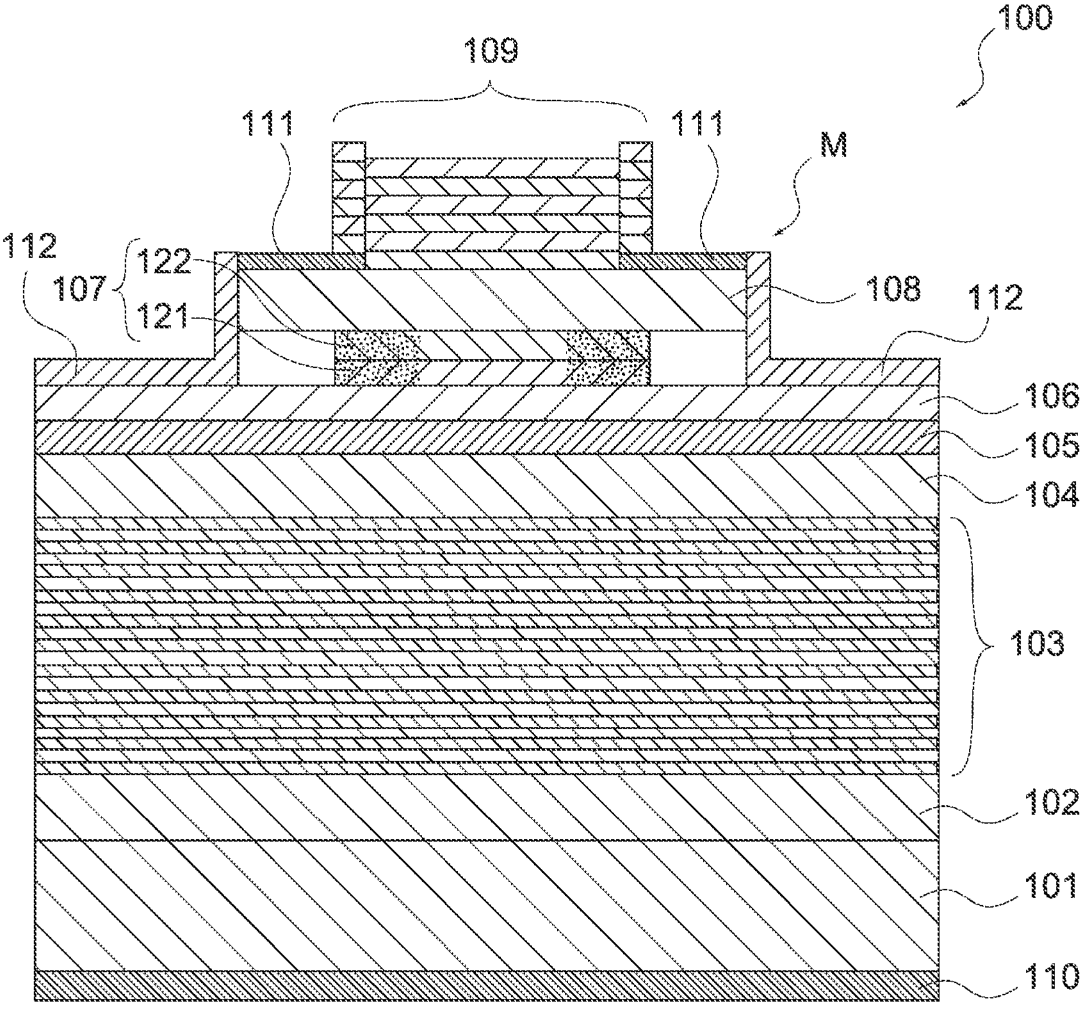
FIG. 1 is a cross-sectional view of a VCSEL device according to a first embodiment of the present technology.
Figure 1:
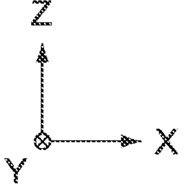

FIG. 1 is a cross-sectional view of a VCSEL device 100 according to this embodiment. As shown in the figure, the VCSEL device 100 includes a substrate 101, a buffer layer 102, a first reflection mirror 103, a first intermediate layer 104, a light-emitting layer 105, a second intermediate layer 106, a tunnel junction layer 107, a third intermediate layer 108, a second reflection mirror 109, a first electrode 110, a second electrode 111, and an insulation layer 112. Note that in each of the figures, the layer surface direction of the respective layers constituting the VCSEL device 100 is an X-Y direction and a direction perpendicular to the layer surface direction is a Z direction.

The substrate 101 supports each layer of the VCSEL device 100. The substrate 101 is formed of a semiconductor material and can be formed of, for example, n-InP. The buffer layer 102 is formed on the substrate 101 and buffers the lattice constants of the substrate 101 and the first reflection mirror 103. The buffer layer 102 is formed of an n-type semiconductor material and can be formed of, for example, n-InP.

The first reflection mirror 103 is provided on the buffer layer 102, reflects light of a wavelength λ, and causes light of a wavelength other than that to be transmitted therethrough. The first reflection mirror 103 is a DBR (Distributed Bragg Reflector) in which a low-refractive index layer and a high-refractive index layer having an optical film thickness of λ/4 are alternately stacked to obtain a plurality of layers, and can be a semiconductor DBR formed of an n-type semiconductor material. The low-refractive index layer is formed of, for example, n-InP, the high-refractive index layer is formed of, for example, n-AlGaInAs, and the number of times of stacking can be, for example, 40 pairs. A dopant can be, for example, Si.

The first intermediate layer 104 is a layer that is provided on the first reflection mirror 103 and transports carriers to the light-emitting layer 105. The first intermediate layer 104 is formed of an n-type semiconductor material and can be formed of, for example, n-InP.

The light-emitting layer 105 is provided on the first intermediate layer 104 and emits and amplifies spontaneous emission light by carrier recombination. The light-emitting layer 105 can be a layer having a multi-quantum well (MQW) structure in which a quantum well layer having a small bandgap and a barrier layer having a bandgap are alternately stacked. The quantum well layer and the barrier layer are formed of, for example, AlGaInAs with different compositions, the emission wavelength can be 1450 nm, and the number of wells can be four.

The second intermediate layer 106 is a layer that is provided on the first reflection mirror 103 and transports carriers to the light-emitting layer 105. The first intermediate layer 104 is formed of a p-type semiconductor material and can be formed of, for example, p-InP.

Figure 2:
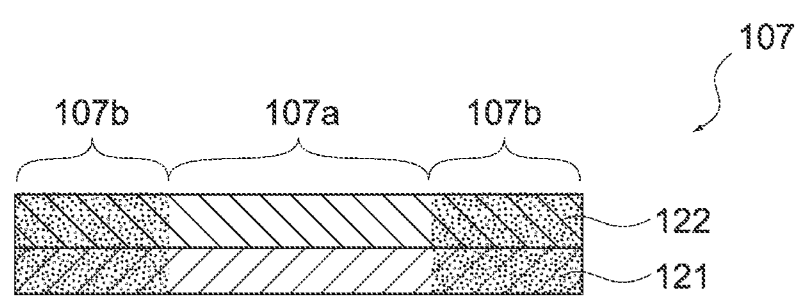
FIG. 2 is a cross-sectional view of a tunnel junction layer included in the VCSEL device.
Figure 2:
Figure 3:
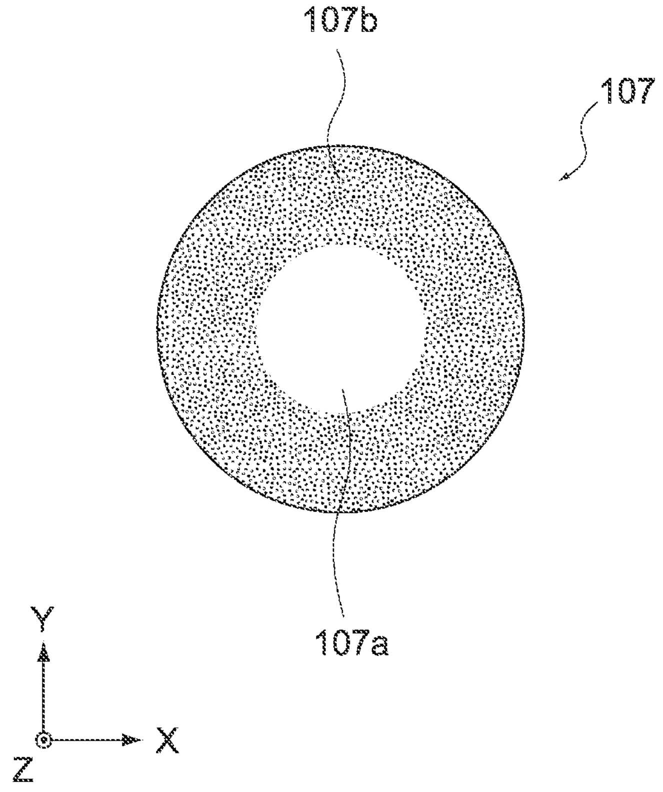
FIG. 3 is a plan view of the tunnel junction layer included in the VCSEL device.

The tunnel junction layer 107 is formed on the second intermediate layer 106 to form a tunnel junction. FIG. 2 is a cross-sectional view of the tunnel junction layer 107. FIG. 3 is a plan view of the tunnel junction layer 107 and is a diagram of the tunnel junction layer 107 when viewed from the Z direction.

As shown in FIG. 2, the tunnel junction layer 107 includes a first highly doped layer 121 and a second highly doped layer 122. The first highly doped layer 121 is a layer on the side of the second intermediate layer 106, the second highly doped layer 122 is a layer on the side of the third intermediate layer 108. Further, as shown in FIG. 3, the tunnel junction layer 107 has an inner peripheral region 107*a* and an outer peripheral region 107*b*. The inner peripheral region 107*a* is a region located on the inner peripheral side of the tunnel junction layer 107, and the outer peripheral region 107*b* is an annular region surrounding the inner peripheral region 107*a*.

The inner peripheral region 107*a* of the first highly doped layer 121 is formed of a highly doped p-type semiconductor material containing Al, and can be formed of, for example, $p^+$-AlInAs. The inner peripheral region 107*a* of the second highly doped layer 122 is formed of a highly doped n-type semiconductor material containing Al, and can be formed of, for example, $n^+$-AlInAs.

Note that the material of the first highly doped layer 121 and the second highly doped layer 122 is a material lattice-matched with the material of the substrate 101. For example, in the case where the substrate 101 is formed of InP, the first highly doped layer 121 and the second highly doped layer 122 can be formed of $Al_{0.43}In_{0.53}As$ highly doped with a p-type or n-type dopant.

The outer peripheral region 107*b* of each of the first highly doped layer 121 and the second highly doped layer 122 is formed of a material obtained by oxidizing the material of the inner peripheral region 07*b* and has insulating properties. That is, the outer peripheral region 107*b* of each of the first highly doped layer 121 and the second highly doped layer 122 contains an Al oxide, and can be formed of, for example, an AlInAs oxide. The thicknesses of the first highly doped layer 121 and the second highly doped layer 122 can each be 20 nm. Further, the distance between the tunnel junction layer 107 and the light-emitting layer 105 is suitably λ/4.

The third intermediate layer 108 is provided on the tunnel junction layer 107 and transports carriers from the second electrode 111 to the tunnel junction layer 107. The third intermediate layer 108 also serves as a contact layer for the second electrode 111. Further, as a contact layer, a highly doped layer may be separately provided between the third intermediate layer 108 and the second electrode 111. The third intermediate layer 108 is formed of an n-type semiconductor material and can be formed of, for example, n-InP. The third intermediate layer 108 and the tunnel junction layer 107 form a mesa structure described below.

The second reflection mirror 109 is provided on the third intermediate layer 108, reflects light of the wavelength λ, and causes light of a wavelength other than that to be transmitted therethrough. The second reflection mirror 109 is a DBR in which a low-refractive index layer and a high-refractive index layer having an optical film thickness of λ/4 are alternately stacked to obtain a plurality of layers, and can be a dielectric DBR formed of a dielectric. The low-refractive index layer is formed of, for example, $SiO_2$, the high-refractive index layer is formed of, for example, $Ta_2O_5$, and the number of times of stacking can be eight pairs.

The first electrode 110 is provided on the back surface of the substrate 101 and functions as one electrode of the VCSEL device 100. The first electrode 110 can be formed of, for example, Ti/Pt/Au. The second electrode 111 is provided on the third intermediate layer 108 and functions as the other electrode of the VCSEL device 100. The second electrode 111 can have an annular shape surrounding the second reflection mirror 109 and can have, for example, an inner diameter of 10 μm and an outer diameter of 100 μm. The second electrode 111 can be formed of, for example, Ti/Pt/Au.

The insulation layer 112 is provided on the second intermediate layer 106 and the side surface of the mesa structure and insulates the second intermediate layer 106 and the side surface of the mesa structure. The insulation layer 112 can be formed of an insulating material such as SiN.

The VCSEL device 100 has the structure described above. As described above, the buffer layer 102, the first intermediate layer 104, the third intermediate layer 108, and the second highly doped layer 122 are each formed of an n-type semiconductor material as a first conductivity type, and the dopant can be Si. The second intermediate layer 106 and the first highly doped layer 121 are each formed of a p-type semiconductor material as a second conductivity type, and the dopant of the second intermediate layer 106 can be Mg. Further, the dopant of the first highly doped layer 121 is suitably C that is difficult to diffuse.

The doping concentration is, for example, $5\times10^{19}$ [$cm^{-3}$] for the first highly doped layer 121 and the second highly doped layer 122 and approximately $5\times10^{17}$~$1\times10^{18}$ [$cm^{-3}$] for the other layers. Note that the first conductivity type and the second conductivity type in the VCSEL device 100 may be reversed, i.e., the first conductivity type may be the p-type and the second conductivity type may be the n-type.

[Regarding Mesa Structure]

Figure 4:
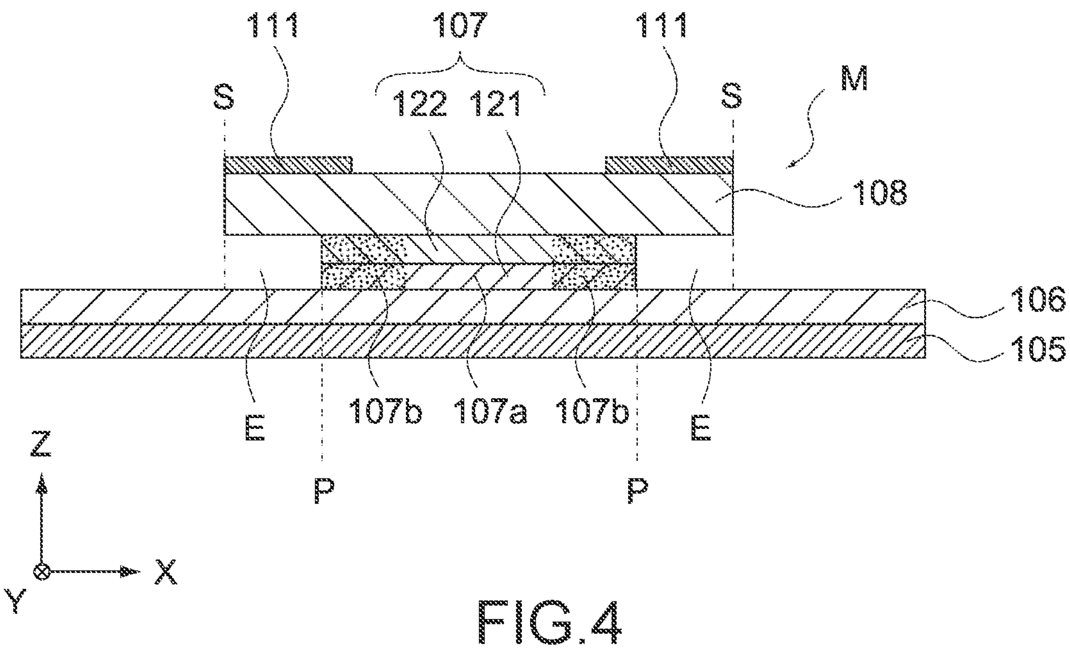
FIG. 4 is a cross-sectional view of part of the VCSEL device.
Figure 5:
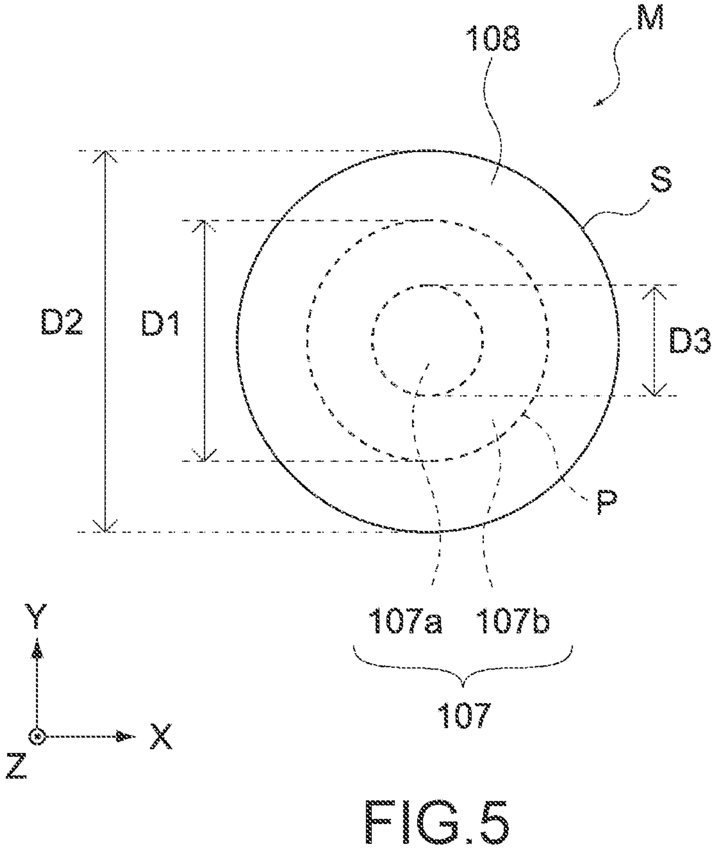
FIG. 5 is a plan view of a mesa structure of the VCSEL device.

The VCSEL device 100 has a mesa structure. FIG. 4 is a cross-sectional view showing a partial configuration of the VCSEL device 100, including a mesa structure. FIG. 5 is a plan view of the mesa structure and is a diagram of the mesa structure when viewed from the Z direction.

As shown in these figures, the tunnel junction layer 107 and the third intermediate layer 108 are formed in a mesa (plateau) shape to form a mesa structure M. As shown in FIG. 5, the mesa structure M can have a circular shape when viewed from the Z direction. The mesa structure M is formed such that the inner peripheral region 107*a* of the tunnel junction layer 107 is located at the center of the mesa structure M and includes a current injection region described below.

As shown in FIG. 4 and FIG. 5, the side surface of the mesa structure M is referred to as a side surface S. The side surface S is the outer peripheral surface of the mesa structure M along the Z direction and can be a cylindrical surface. Further, the end surface of the tunnel junction layer 107 is referred to as an end surface P. The end surface P is the outer peripheral surface of the outer peripheral region 107*b* along the Z direction and can be a cylindrical surface. As shown in FIG. 4, the outer peripheral region 107*b* is formed to a certain depth in the X-Y direction from the end surface P, and the inner peripheral region 107*a* is separated from the end surface P by the outer peripheral region 107*b*.

As shown in FIG. 5, an outer diameter D1 of the tunnel junction layer 107 is formed to be smaller than an outer diameter D2 of the mesa structure M. As a result, as shown in FIG. 4, the end surface P is located on the side of the inner peripheral region 107*a* than the side surface S and is spaced apart from the side surface S. An annular space E is formed between the end surface P and the side surface S. This space E can be a gap. Further, the space E may be filled with an insulator. Note that the outer diameter D1 can be, for example, 20 μm, and the outer diameter D2 can be, for example, 100 μm. Further, an outer diameter D3 of the inner peripheral region 107*a* can be, for example, 8 μm.

The mesa structure M is formed as described above. Note that the mesa structure M is not limited to the one including only the tunnel junction layer 107 and the third intermediate layer 108 and may be, for example, one including the second intermediate layer 106 in addition thereto. In this case, the end surfaces of the third intermediate layer 108 and the second intermediate layer 106 are on the same surface as the side surface S. Further, the mesa structure M may be one including the light-emitting layer 105, or one including the light-emitting layer 105 and the first intermediate layer 104. In each of the cases, the end surface P is spaced apart from the side surface S, and the end surface of each of the layers other than the tunnel junction layer 107 can be located on the same surface as the side surface S.

[Operation of VCSEL Device]

Figure 6:
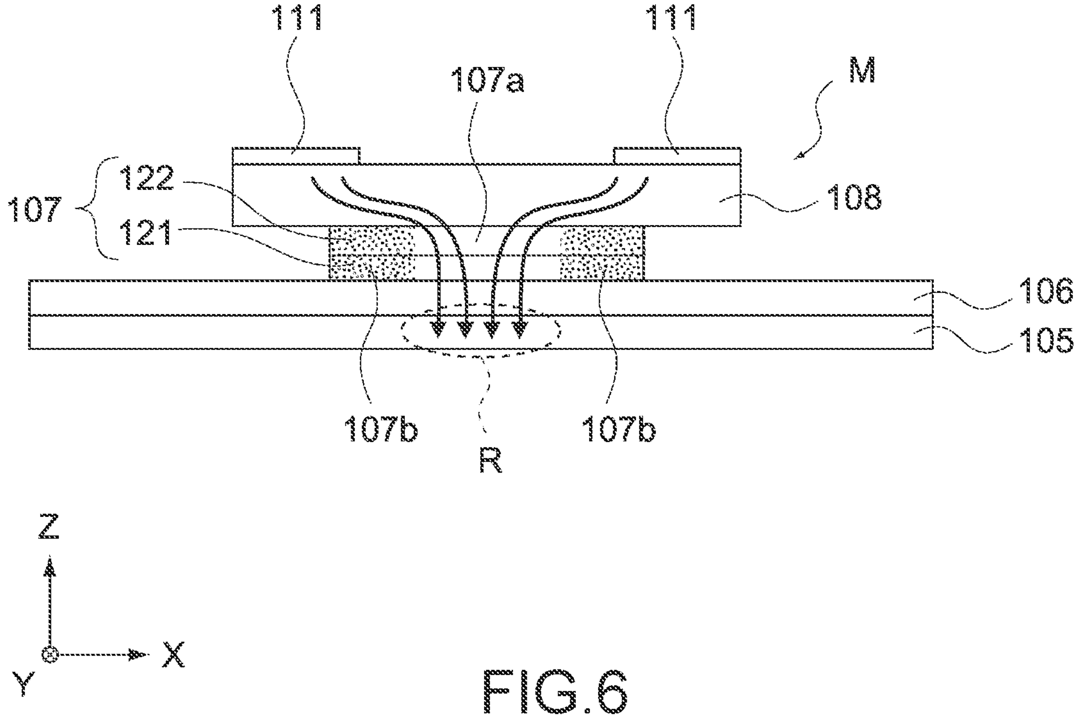
FIG. 6 is a schematic diagram showing an operation of the VCSEL device.

An operation of the VCSEL device 100 will be described. FIG. 6 is a schematic diagram showing the operation of the VCSEL device 100. When a voltage is applied between the first electrode 110 (see FIG. 1) and the second electrode 111, a current flows between the first electrode 110 and the second electrode 111. Here, since the insulating outer peripheral region 107*b* is provide in the tunnel junction layer 107, a current (arrows in the figure) passes through only the inner peripheral region 107*a* as shown in FIG. 6. Therefore, a current concentrates in the vicinity of the inner peripheral region 107*a* to form a current injection region R where a current flowing into the light-emitting layer 105 concentrates.

As a result, spontaneous emission light due to carrier recombination occurs in the current injection region R. The spontaneous emission light travels in the stacking direction (Z direction) of the VCSEL device 100 and is reflected by the first reflection mirror 103 and the second reflection mirror 109. Since the first reflection mirror 103 and the second reflection mirror 109 are configured to reflect light having the oscillation wavelength λ, a component having the oscillation wavelength λ of spontaneous emission light forms a standing wave between the first reflection mirror 103 and the second reflection mirror 109 and is amplified by the light-emitting layer 105. When the injected current exceeds a threshold value, the light forming the standing wave performs laser oscillation and a laser beam is emitted passing through the second reflection mirror 109.

As described above, in the VCSEL device 100, by providing the insulating outer peripheral region 107*b* on the outer periphery side of the tunnel junction layer 107, it is possible to realize a current confinement structure by the tunnel junction layer 107.

[Method of Producing VCSEL Device]

A method of producing the VCSEL device 100 will be described. FIG. 7 to FIG. 12 are each a schematic diagram showing a method of producing the VCSEL device 100.

Figure 7:
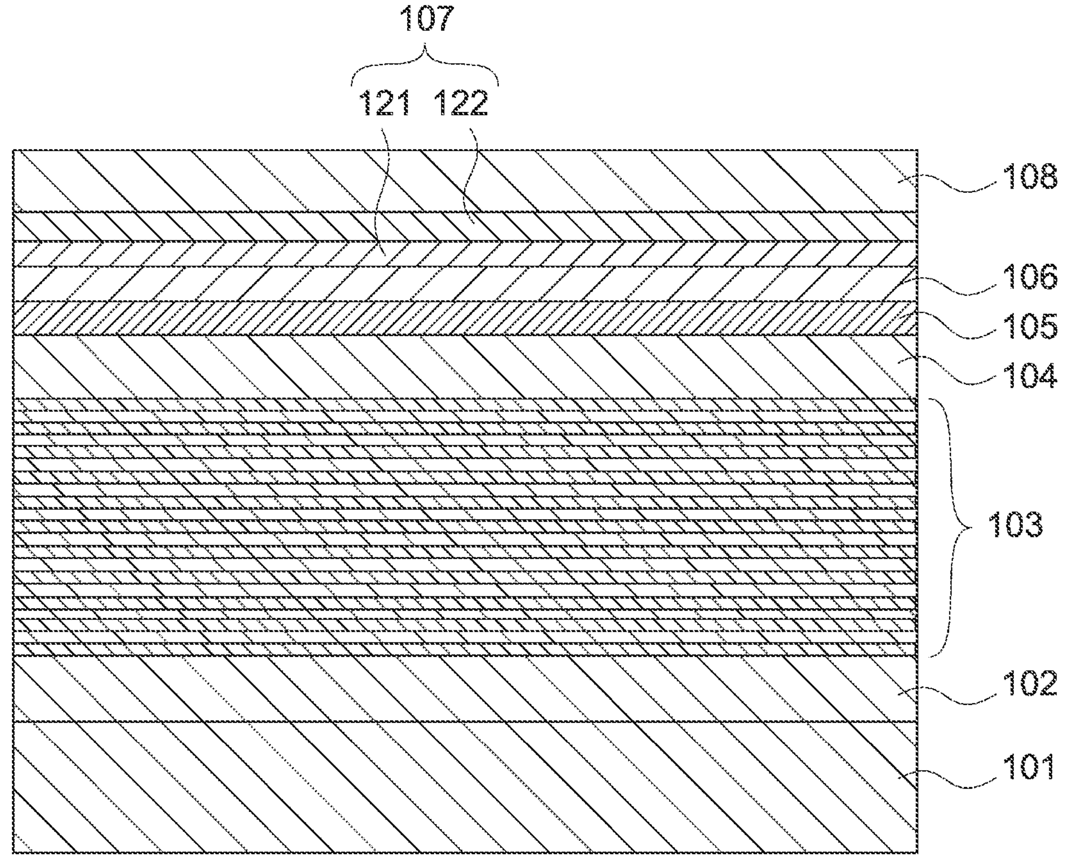
FIG. 7 is a schematic diagram showing a method of producing the VCSEL device.
Figure 7:
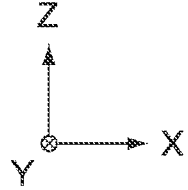

First, as shown in FIG. 7, the buffer layer 102, the first reflection mirror 103, the first intermediate layer 104, the light-emitting layer 105, the second intermediate layer 106, the tunnel junction layer 107, and the third intermediate layer 108 are stacked on the substrate 101 in this order to form a stacked body. These layers can be stacked by a MOCVD (metal organic chemical vapor deposition) method, and doping of a dopant can be performed simultaneously with the stacking.

Figure 8:
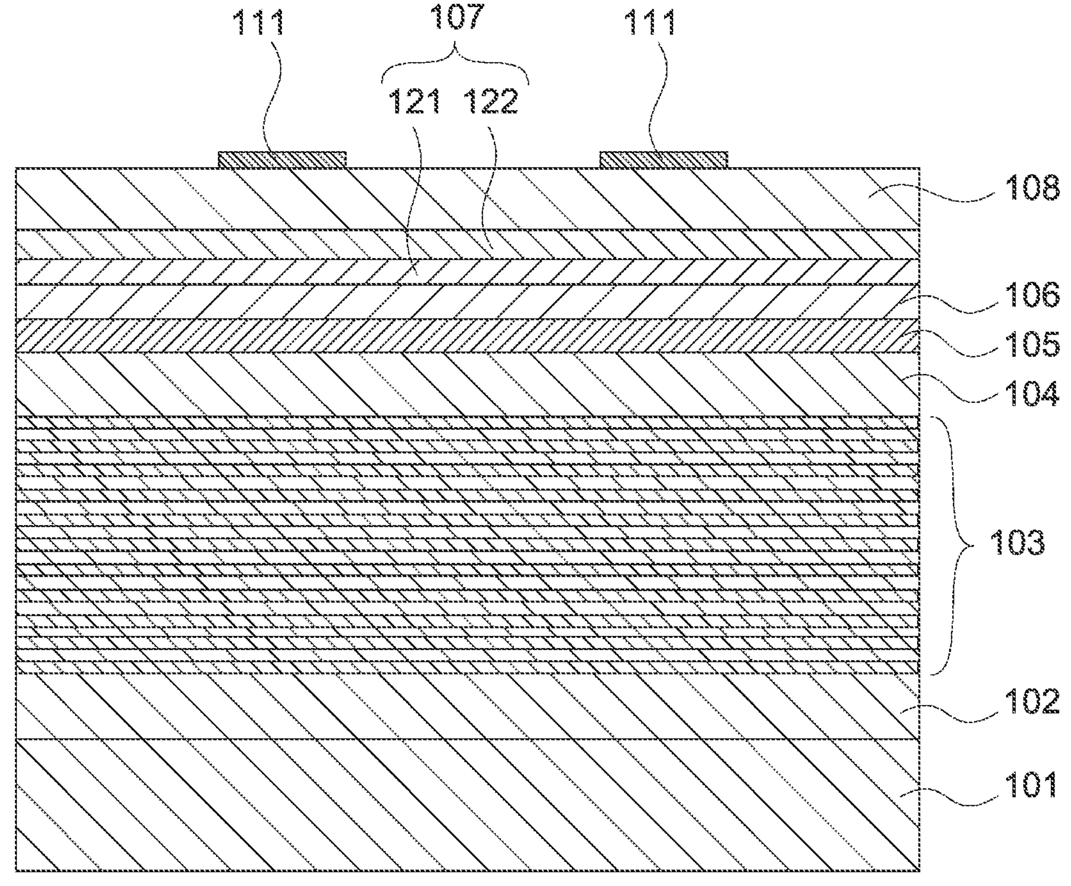
FIG. 8 is a schematic diagram showing the method of producing the VCSEL device.
Figure 8:
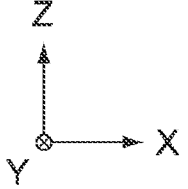
Figure 9:
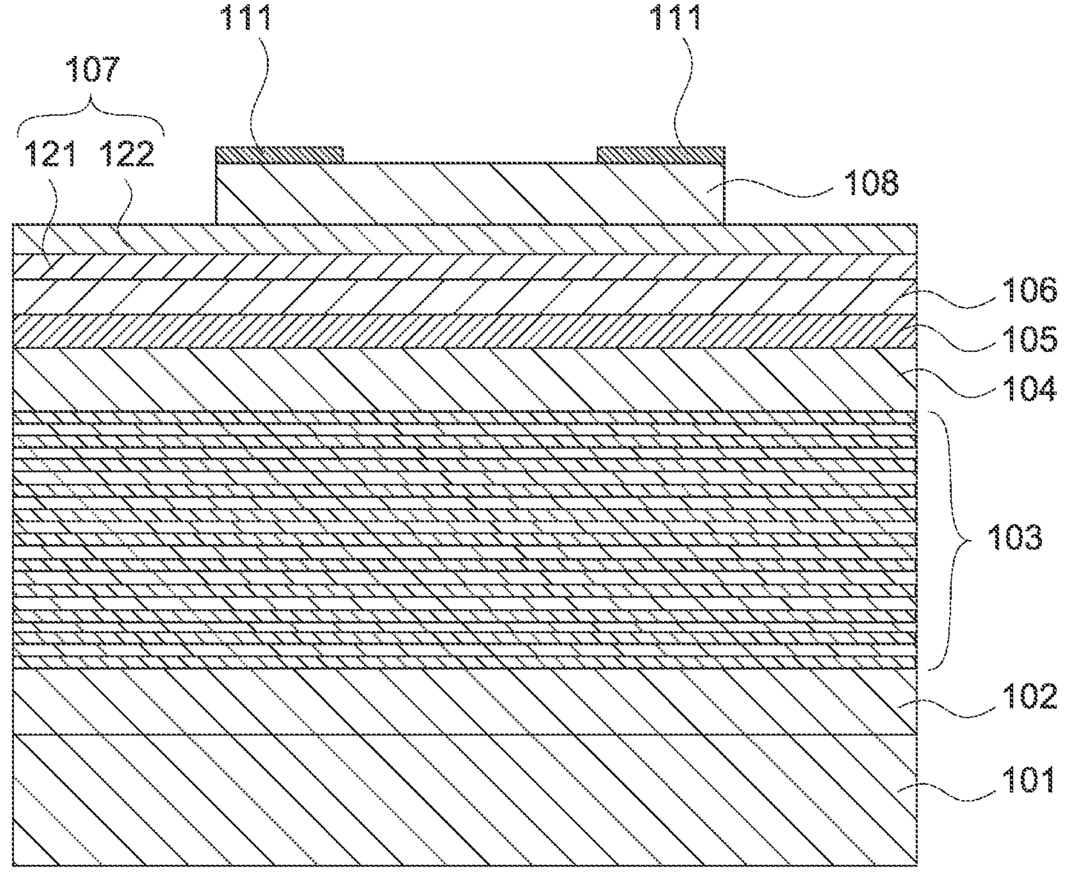
FIG. 9 is a schematic diagram showing the method of producing the VCSEL device.
Figure 9:
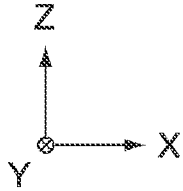

Next, as shown in FIG. 8, the second electrode 111 is formed on the third intermediate layer 108. The second electrode 111 can have an annular shape having an inner diameter of 10 μm and an outer diameter of 100 μm. Further, as shown in FIG. 9, part of the third intermediate layer 108 is removed in accordance with the outer diameter of the second electrode 111. The third intermediate layer 108 can be removed by wet etching, and an etchant is suitably one that dissolves the third intermediate layer 108 and does not dissolve the tunnel junction layer 107. Specifically, in the case where the third intermediate layer 108 is formed of n-InP and the tunnel junction layer 107 is formed of $p^+$-AlInAs and $n^+$-AlInAs, a mixed solution containing hydrogen bromide and hydrogen peroxide can be used as an etchant.

Figure 10:
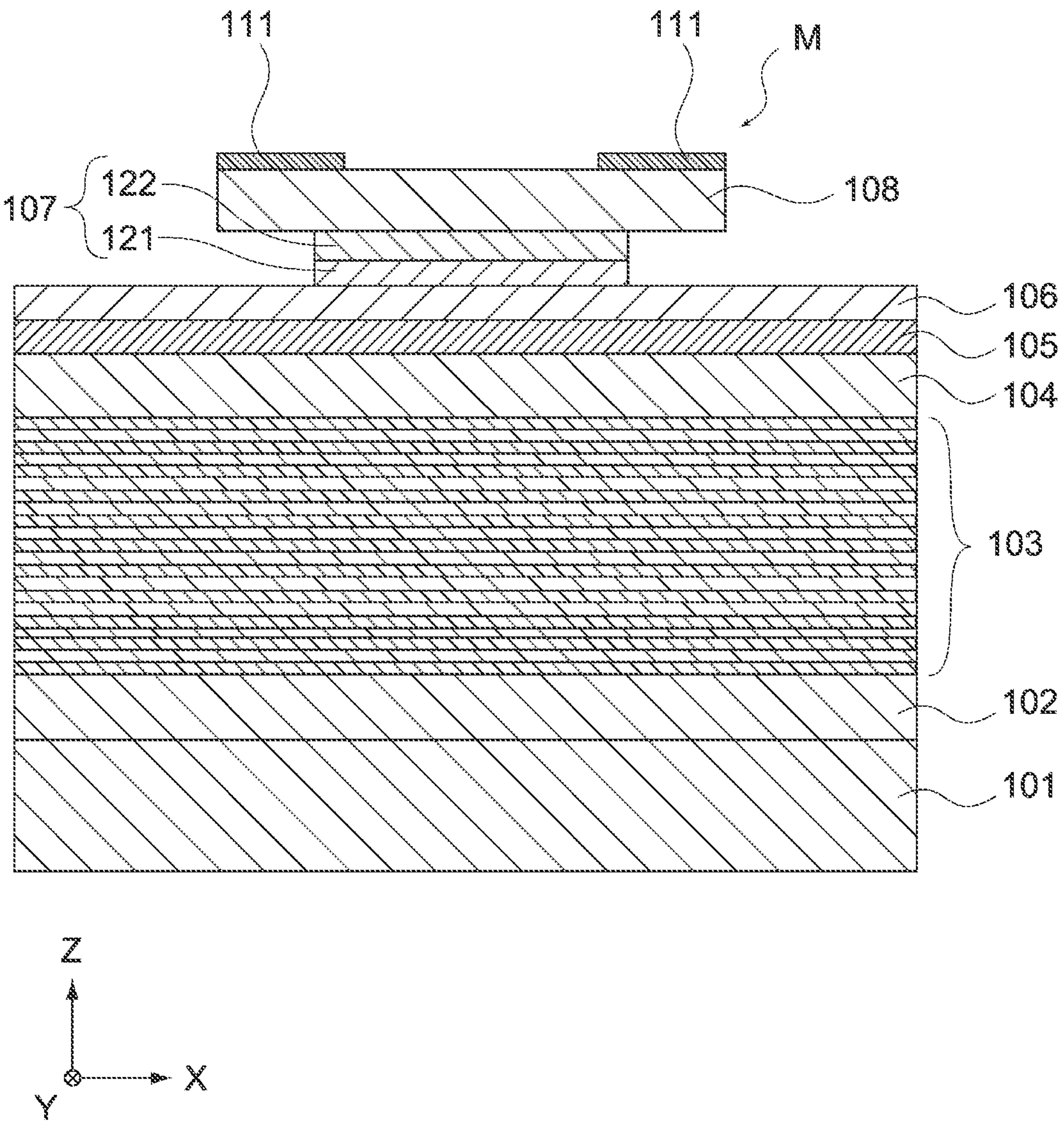
FIG. 10 is a schematic diagram showing the method of producing the VCSEL device.

Next, as shown in FIG. 10, part of the tunnel junction layer 107 is removed. The tunnel junction layer 107 can be removed by wet etching. An etchant is suitably one that dissolves the tunnel junction layer 107 and does not dissolve the third intermediate layer 108 and the second intermediate layer 106. Specifically, in the case where the tunnel junction layer 107 is formed of $p^+$-AlInAs and $n^+$-AlInAs the third intermediate layer 108 is formed of n-InP, and the second intermediate layer 106 is formed of p-InP, a mixed aqueous solution containing sulfuric acid and hydrogen peroxide can be used as an etchant.

By the removal of the third intermediate layer 108 and the tunnel junction layer 107, the mesa structure M is formed. Here, when performing the removal of the tunnel junction layer 107, not only the tunnel junction layer 107 located outside the mesa structure M but also the tunnel junction layer 107 located inside the mesa structure M is etched from the outer periphery side toward the inner peripheral side (side etching).

As a result, the end surface P of the tunnel junction layer 107 is spaced apart from the side surface S of the mesa structure M (see FIG. 4). The etching amount of this side etching can be adjusted by the etching time, and can be set to, for example, 40 μm from the side surface S. In this case, when the outer diameter D2 (see FIG. 5) of the second electrode 111 and the mesa structure M is 100 μm, the outer diameter D1 of the tunnel junction layer 107 is 20 μm.

Figure 11:
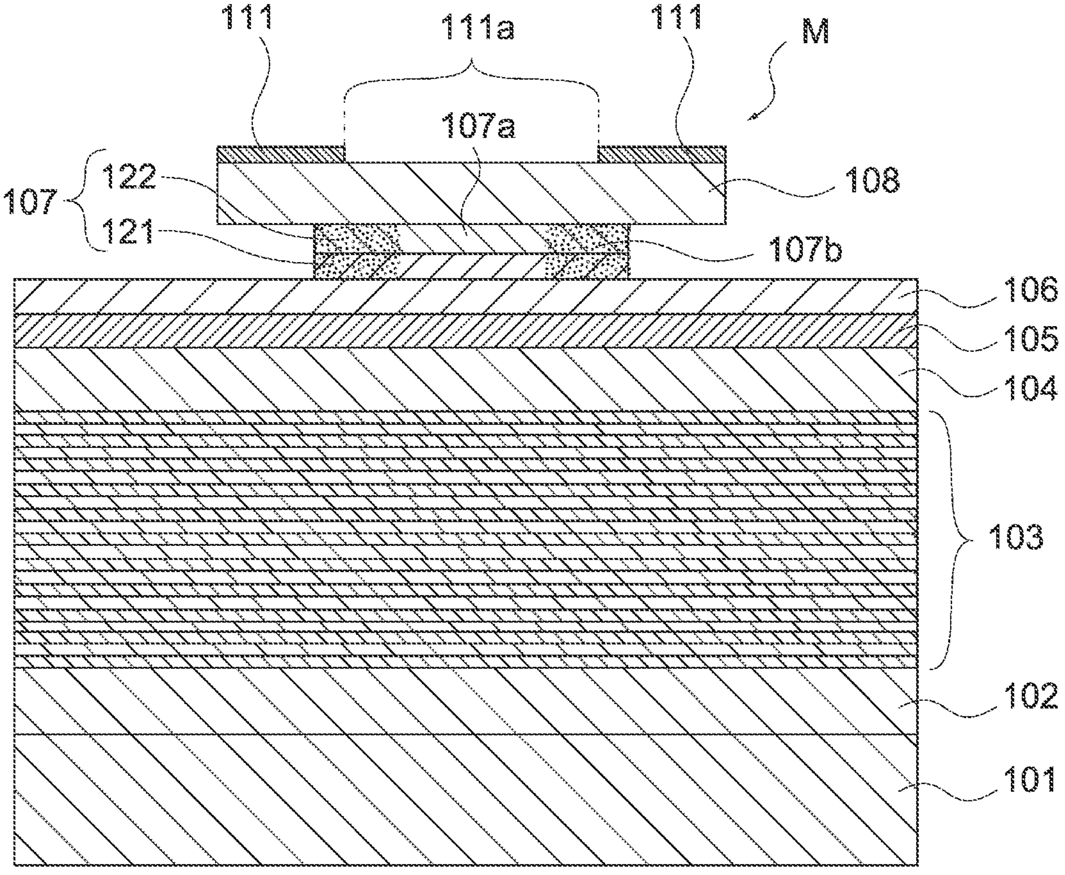
FIG. 11 is a schematic diagram showing the method of producing the VCSEL device.
Figure 11:
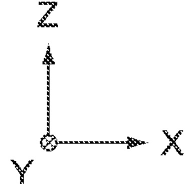

Subsequently, as shown in FIG. 11, the tunnel junction layer 107 is selectively oxidized from the outer periphery side. As a result, the constituent material of the tunnel junction layer 107 is oxidized in the outer peripheral region 107*b*, and an Al oxide is generated in the outer peripheral region 107*b*. The inner peripheral region 107*a* is not oxidized because it is spaced apart from the end surface P, and is maintained as the material containing Al. This oxidation can be performed by placing a stacked body in an oxidation furnace and heating it to 400° C. to 450° C. in a steam atmosphere.

Since oxidation selectively proceeds in a layer having a high Al composition, only the tunnel junction layer 107 can be oxidized by increasing the Al composition of the tunnel junction layer 107. Here, the tunnel junction layer 107 is side-etched as described above, and the outer diameter D1 is smaller than the outer diameter D2 (see FIG. 5). For this reason, the oxidation can be completed in a short time.

Specifically, as shown in FIG. 11, the outer peripheral region 107*b* can be formed by oxidizing the tunnel junction layer 107 to the inside by 1 μm than an opening 111*a* of the second electrode 111, and the width of the outer peripheral region 107*b* in the X-Y direction can be 6 μm. In the case where the diameter of the opening 111*a* is 10 μm, the outer diameter D3 (see FIG. 5) of the inner peripheral region 107*a* is 8 μm.

Figure 12:
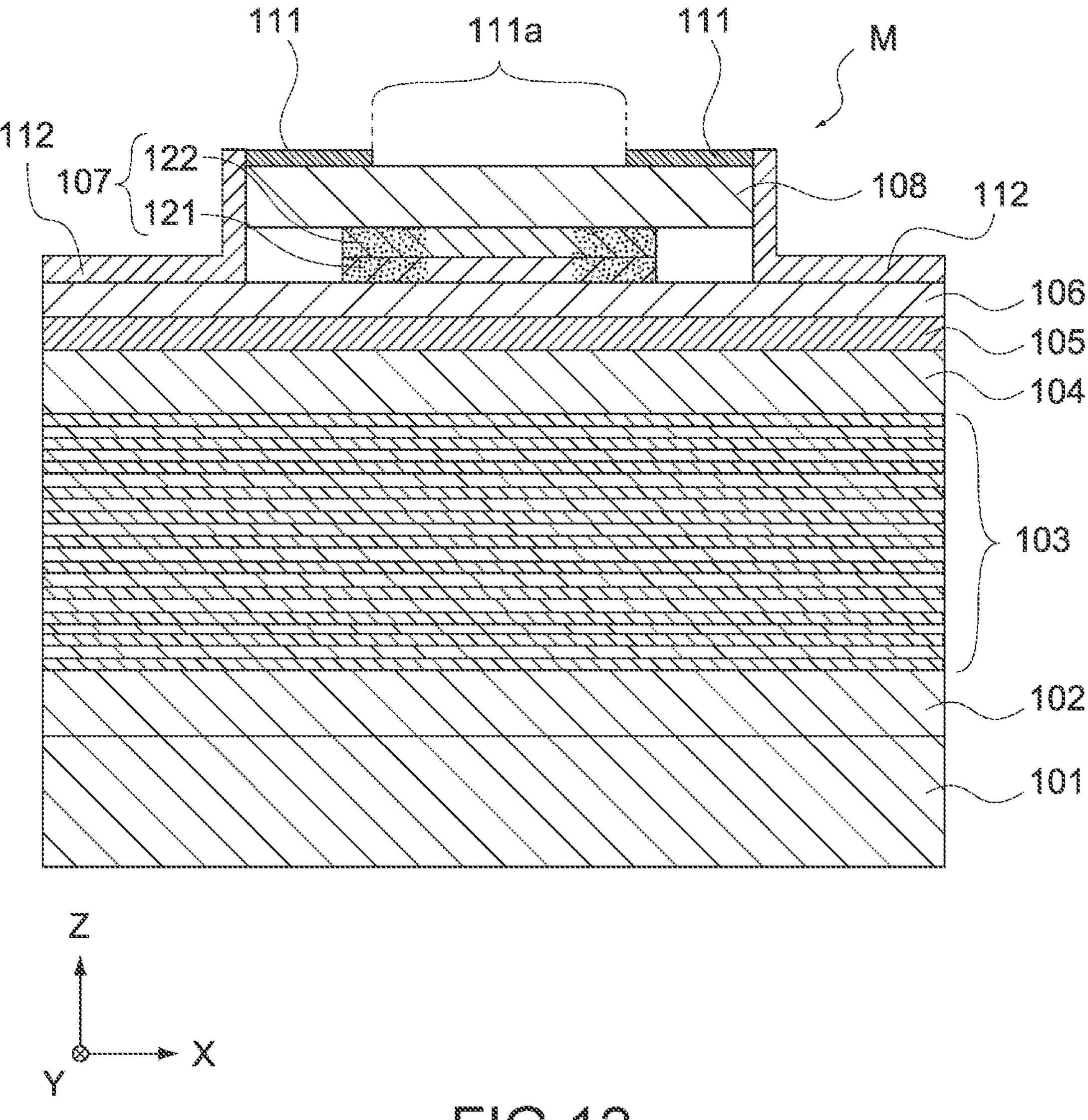
FIG. 12 is a schematic diagram showing the method of producing the VCSEL device.
Figure 13:
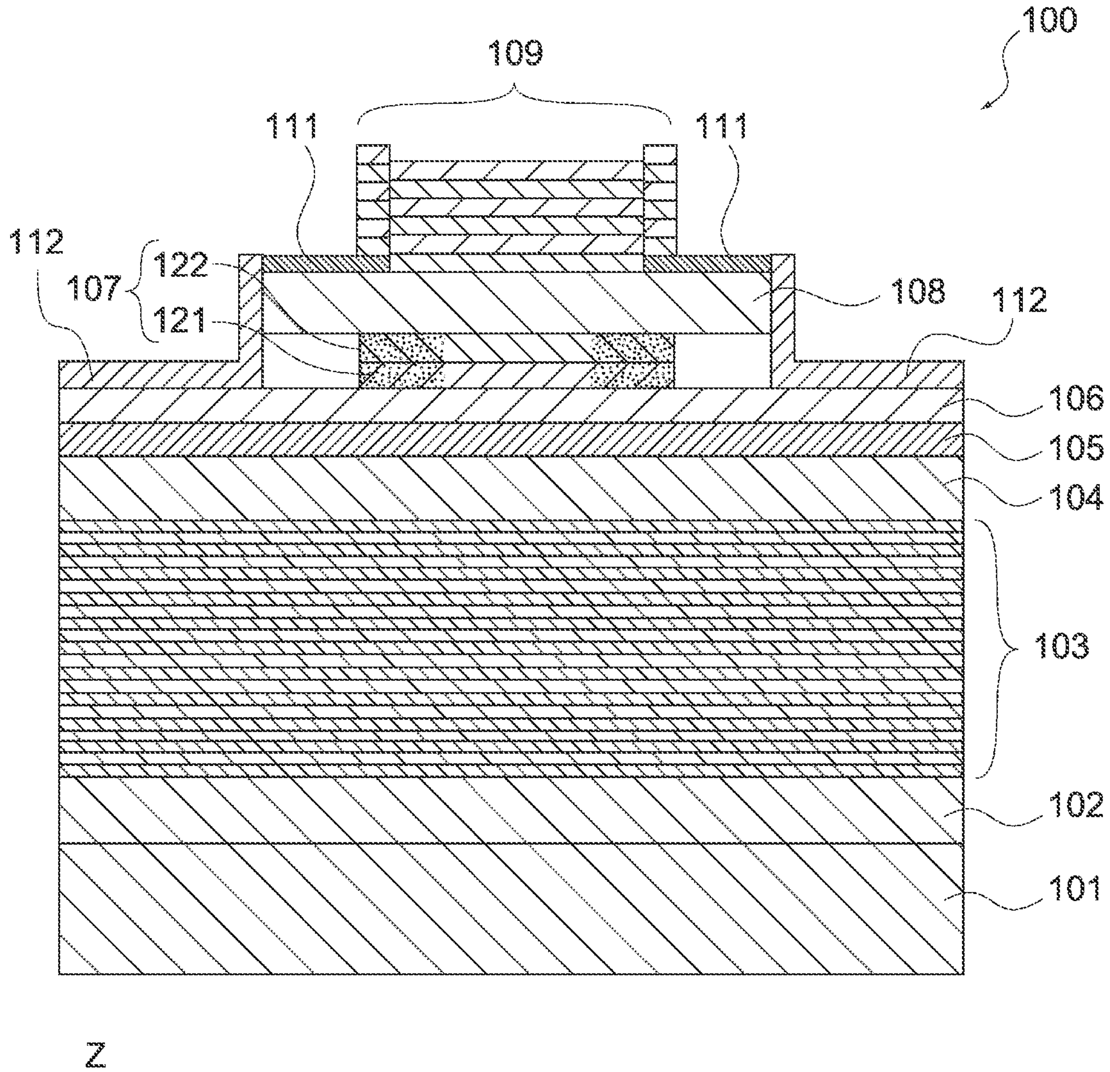
FIG. 13 is a schematic diagram showing the method of producing the VCSEL device.

Subsequently, as shown in FIG. 12, the insulation layer 112 is formed on the second intermediate layer 106 and on the side surface S of the mesa structure M. Further, as shown in FIG. 13, the second reflection mirror 109 is formed on the opening 111*a*. The second reflection mirror 109 can be formed by uniformly stacking a low-refractive index layer and a high-refractive index layer to obtain a plurality of layers and then removing part thereof except for the vicinity of the opening 111*a*.

Subsequently, the first electrode 110 (see FIG. 1) is formed on the substrate 101, and the obtained product can be divided into pieces for each device to produce the VCSEL device 100. The VCSEL device 100 can be caused to operate by being mounted on a heat sink or the like and electrically connected by wire bonding or the like.

The VCSEL device 100 can be produced in this way. As described above, the tunnel junction layer 107 is side-etched before oxidation and the outer diameter D1 is smaller than the outer diameter D2. In general, since the oxidation rate of AlInAs is lower than that of AlAs used for an oxidation confinement layer, it is necessary to oxidize AlInAs at a high temperature of approximately 500° C. in order to oxidize AlInAs at realistic oxidation rate.

However, at this high temperature, there is a problem that P and As are separated and the crystal deteriorates. Here, in the production method according to this embodiment, by reducing the outer diameter D1 by side-etching, it is possible to complete oxidation in a short time even in the case where the tunnel junction layer 107 is formed of AlInAs. As a result, it is possible to complete oxidation at 400° C. to 450° C. at which P and As are not significantly separated, and produce the VCSEL device 100 having a current confinement structure by a producible method.

Second Embodiment

A VCSEL device according to a second embodiment of the present technology will be described.

[Structure of VCSEL Device]

Figure 14:
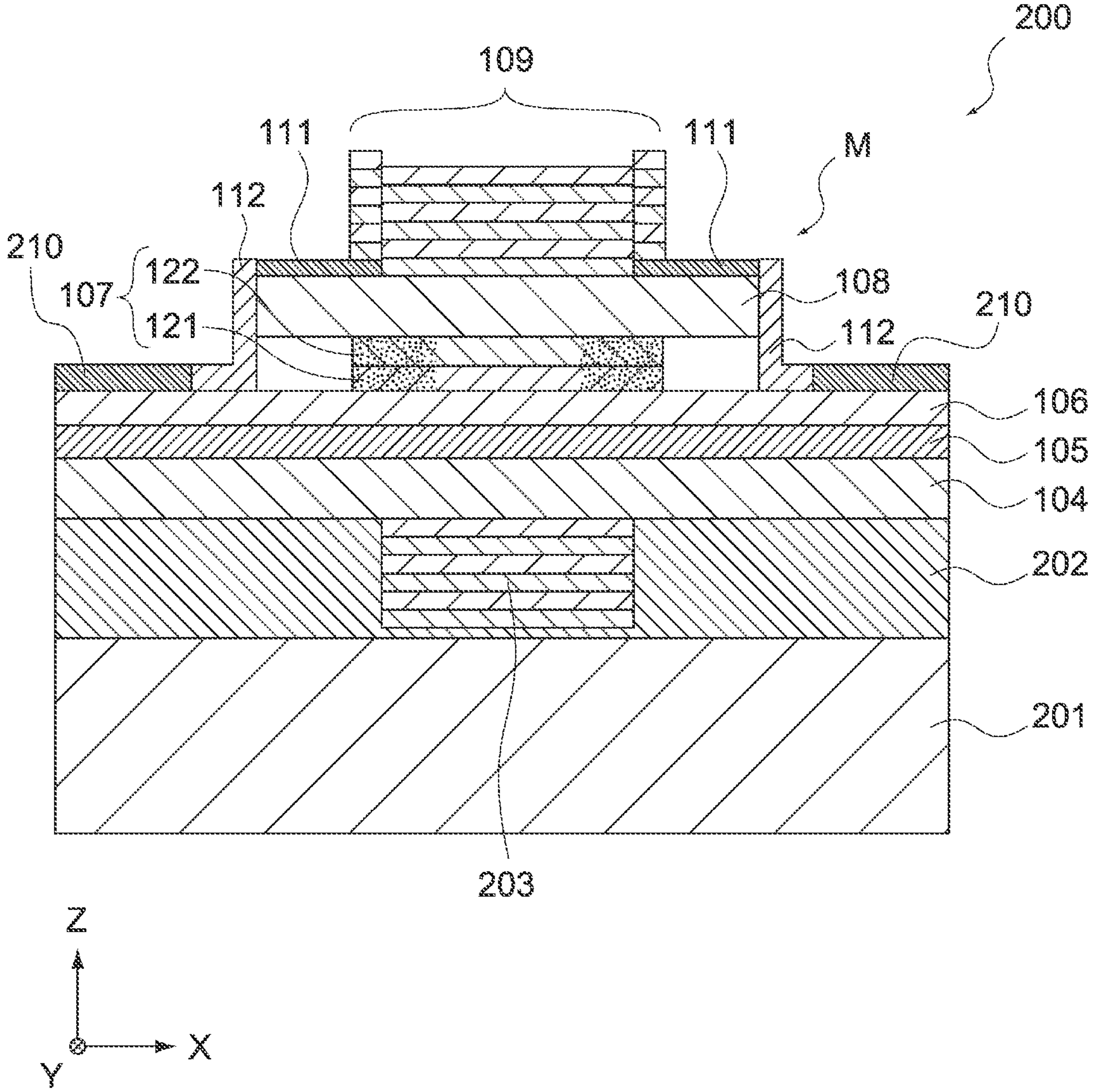
FIG. 14 is a cross-sectional view of a VCSEL device according to a second embodiment of the present technology.

FIG. 14 is a cross-sectional view of a VCSEL device 200 according to this embodiment. Note that the same configurations of the VCSEL device 200 according to this embodiment as those of the VCSEL device 100 according to the first embodiment will be denoted by the same reference symbols as those of the VCSEL device 100, and description thereof will be omitted.

As shown in FIG. 14, the VCSEL device 200 includes a substrate 201, a bonding layer 202, a first reflection mirror 203, the first intermediate layer 104, the light-emitting layer 105, the second intermediate layer 106, the tunnel junction layer 107, the third intermediate layer 108, the second reflection mirror 109, a first electrode 210, the second electrode 111, and the insulation layer 112.

The substrate 201 supports each layer of the VCSEL device 100. The substrate 201 can be formed of, for example, Si. The bonding layer 202 bonds the substrate 201 and the first intermediate layer 104 to each other. The bonding layer 202 can be formed of, for example, solder.

The first reflection mirror 203 is provided on the back surface of the first intermediate layer 104, reflects light of the wavelength λ, and causes light of a wavelength other than that to be transmitted therethrough. The first reflection mirror 203 is a DBR in which a low-refractive index layer and a high-refractive index layer having an optical film thickness of λ/4 are alternately stacked to obtain a plurality of layers, and can be a dielectric DBR formed of a dielectric. The low-refractive index layer is formed of, for example, $SiO_2$, the high-refractive index layer is formed of, for example, $Ta_2O_5$, and the number of times of stacking can be 10 pairs. The first reflection mirror 203 is provided at a position facing the current injection region via other layers in the Z direction.

The first intermediate layer 104, the light-emitting layer 105, the second intermediate layer 106, the tunnel junction layer 107, the third intermediate layer 108, the second reflection mirror 109, the second electrode 111, and the insulation layer 112 have configurations similar to those in the first embodiment. Note that the second reflection mirror 109 may be a semiconductor DBR instead of a dielectric DBR.

The first electrode 210 is provided on the second intermediate layer 106 and functions as one electrode of the VCSEL device 200. The first electrode 210 can have an annular shape surrounding the mesa structure M and can be formed of, for example, Ti/Pt/Au.

The VCSEL device 200 has the configuration as described above. Note that the thickness of the first intermediate layer 104 is suitably 5λ in an optical film thickness. Further, the first conductivity type and the second conductivity type in the VCSEL device 200 may be reversed, i.e., the first conductivity type may be the p-type and the second conductivity type may be the n-type.

The mesa structure M of the VCSEL device 200 has the same configuration as that of the VCSEL device 100, and is configured such that the end surface P of the tunnel junction layer 107 is spaced apart from the side surface S of the mesa structure M (see FIG. 4).

Also the operation of the VCSEL device 200 is similar to that of the VCSEL device 100. When a voltage is applied between the first electrode 210 and the second electrode 111, the current injection region R (see FIG. 6) is formed by the current confinement structure of the tunnel junction layer 107. The spontaneous emission light causes laser oscillation by the first reflection mirror 203 and the second reflection mirror 109, a laser beam is emitted passing through the second reflection mirror 109.

[Method of Producing VCSEL Device]

A method of producing the VCSEL device 200 will be described. FIG. 15 to FIG. 18 are each a schematic diagram showing a method of producing the VCSEL device 100.

Figure 15:
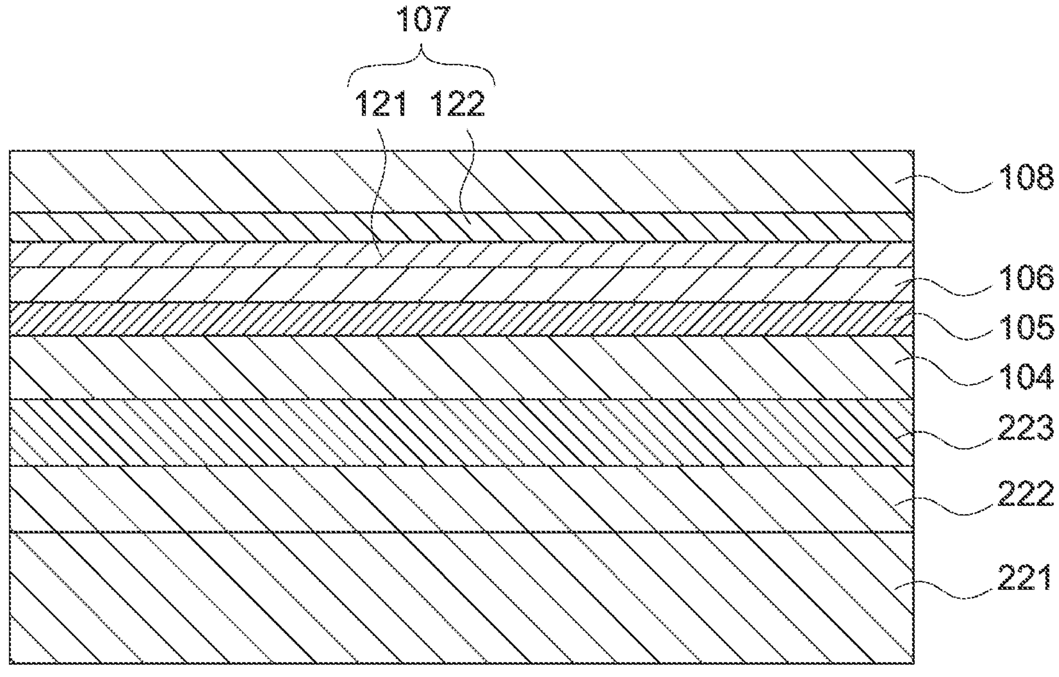
FIG. 15 is a schematic diagram showing a method of producing the VCSEL device.
Figure 15:
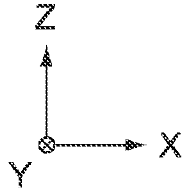

First, as shown in FIG. 15, a buffer layer 222, an etching stop layer 223, the first intermediate layer 104, the light-emitting layer 105, the second intermediate layer 106, the tunnel junction layer 107, and the third intermediate layer 108 are stacked on a substrate 221 in this order to form a stacked body. These layers can be stacked by a MOCVD method, and doping of a dopant can be performed simultaneously with the stacking. The substrate 221 is, for example, an n-InP substrate, the buffer layer 222 can be a layer formed of, for example, n-InP, and the etching stop layer 223 can be a layer formed of, for example, n-InGaAs.

Figure 16:
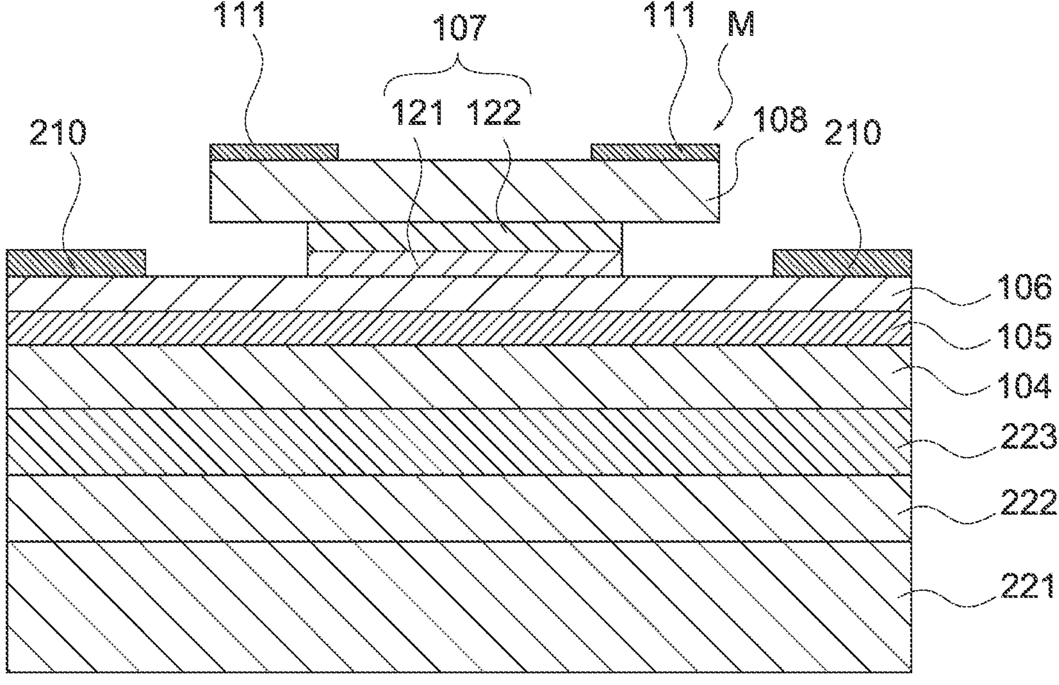
FIG. 16 is a schematic diagram showing the method of producing the VCSEL device.

Next, as shown in FIG. 16, the second electrode 111 is formed on the third intermediate layer 108 and then, part of the third intermediate layer 108 and the tunnel junction layer 107 is removed. This process can be performed in a way similar to that in the first embodiment. As a result, the mesa structure M is formed and the tunnel junction layer 107 is side-etched. Further, the first electrode 210 is formed on the second intermediate layer 106.

Figure 17:
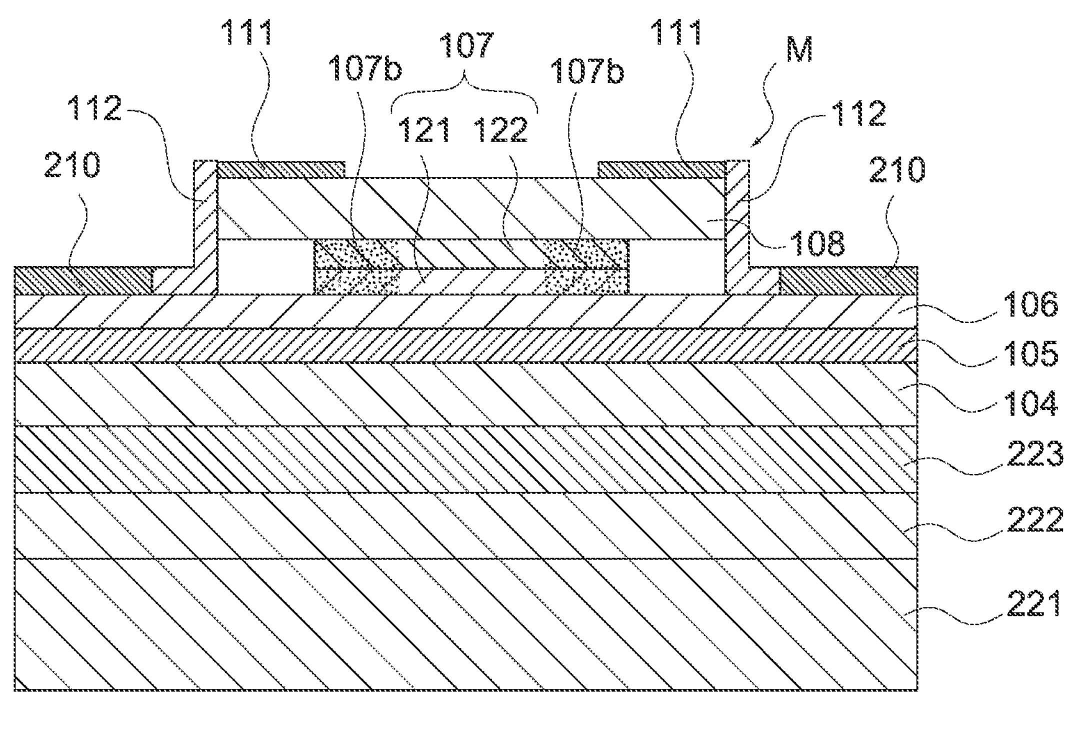
FIG. 17 is a schematic diagram showing the method of producing the VCSEL device.
Figure 17:
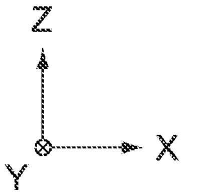

Subsequently, as shown in FIG. 17, the tunnel junction layer 107 is oxidized from the outer periphery side to generate an Al oxide in the outer peripheral region **107*b* and the insulation layer 112 is formed on the second intermediate layer 106 and on the side surface of the mesa structure M, similarly to the first embodiment. Further, the second reflection mirror 109 is formed on the opening 111*a***.

Figure 18:
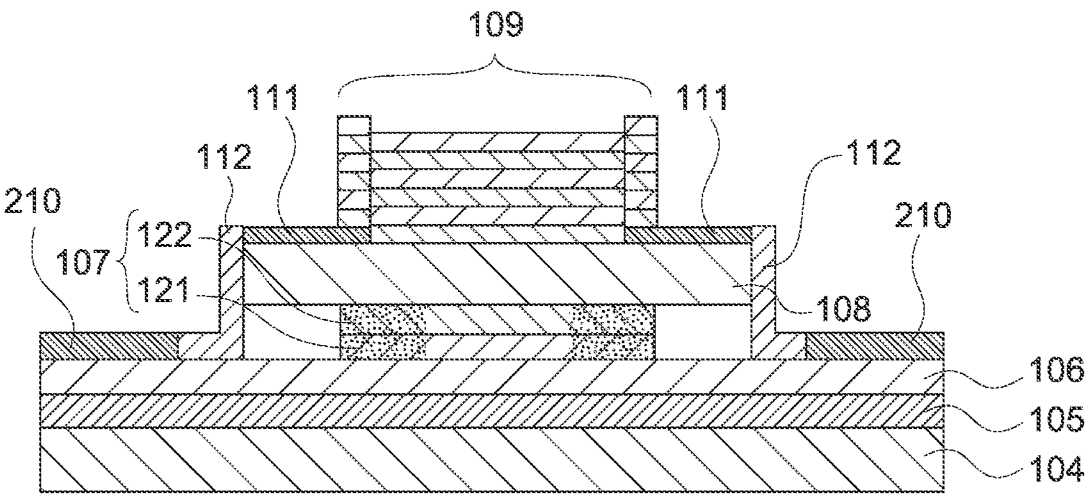
FIG. 18 is a schematic diagram showing the method of producing the VCSEL device.

Subsequently, as shown in FIG. 18, the substrate 221, the buffer layer 222, and the etching stop layer 223 are removed. The removal of these layers can be performed by attaching the stacked body to a support substrate with wax or the like and then performing etching. Further, the first reflection mirror 203 (see FIG. 14) is formed on the back surface of the first intermediate layer 104. The second reflection mirror 203 can be formed by uniformly stacking a low-refractive index layer and a high-refractive index layer to obtain a plurality of layers and then removing part thereof except for the vicinity of the current injection region.

After that, the bonding layer 202 is provided on the back surface of the first intermediate layer 104, the substrate 201 is attached thereto, and then, the support substrate is removed. Thus, the obtained product can be divided into pieces for each device to produce the VCSEL device 200. The VCSEL device 200 can be caused to operate by being mounted on a heat sink or the like and electrically connected by wire bonding or the like.

Since the tunnel junction layer 107 is side-etched also in the VCSEL device 200 similarly to the first embodiment, it is possible to complete oxidation in a short time even in the case where the tunnel junction layer 107 is formed of AlInAs. Therefore, it is possible to produce the VCSEL device 200 having a current confinement structure by a producible method.

Third Embodiment

A VCSEL device according to a third embodiment of the present technology will be described.

[Structure of VCSEL Device]

Figure 19:
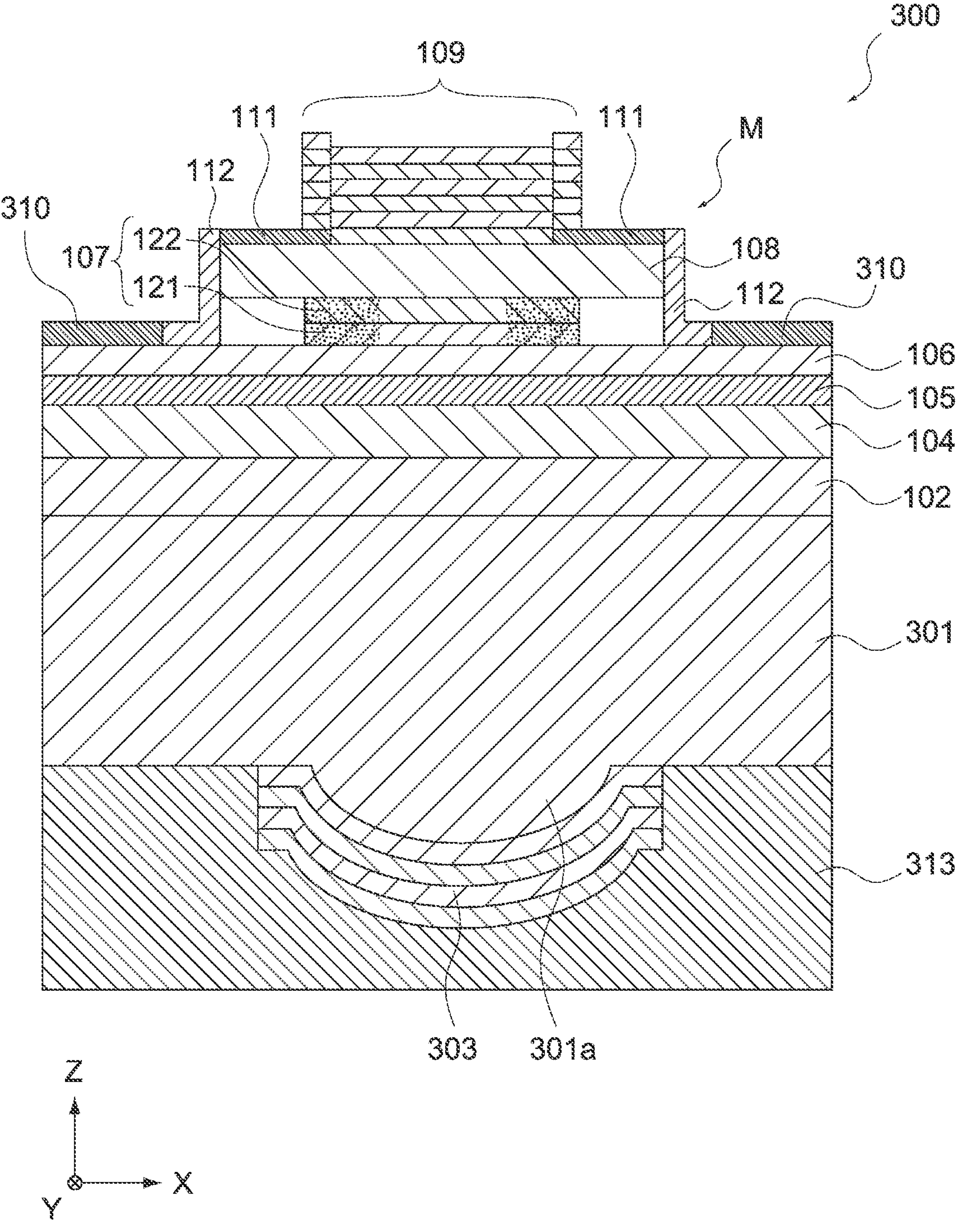
FIG. 19 is a cross-sectional view of a VCSEL device according to a third embodiment of the present technology.

FIG. 19 is a cross-sectional view of a VCSEL device 300 according to this embodiment. Note that the same configurations of the VCSEL device 300 according to this embodiment as those of the VCSEL device 100 according to the first embodiment will be denoted by the same reference symbols as those of the VCSEL device 100, and description thereof will be omitted.

As shown in FIG. 19, the VCSEL device 300 includes a substrate 301, the buffer layer 102, a first reflection mirror 303, the first intermediate layer 104, the light-emitting layer 105, the second intermediate layer 106, the tunnel junction layer 107, the third intermediate layer 108, the second reflection mirror 109, a first electrode 310, the second electrode 111, the insulation layer 112, and a metal layer 313.

The substrate 301 supports each layer of the VCSEL device 300. The substrate 301 is formed of a semi-insulating material and can be formed of, for example, semi-insulating InP. A projecting portion 301*a* for making the first reflection mirror 303 have a lens shape is provided on the substrate 301.

The first reflection mirror 303 is provided on the back surface of the substrate 301, reflects light of the wavelength λ, and causes light of a wavelength other than that to be transmitted therethrough. The first reflection mirror 303 is formed on the projecting portion 301*a* and is formed in a lens shape that collects light on the current injection region, the lens shape having a recessed surface. The lens shape of the first reflection mirror 303 may be a spherical lens shape, a cylindrical lens shape, or another lens shape.

The first reflection mirror 303 is a DBR in which a low-refractive index layer and a high-refractive index layer having an optical film thickness of λ/4 are alternately stacked to obtain a plurality of layers, and can be a dielectric DBR formed of a dielectric. The low-refractive index layer is formed of, for example, $SiO_2$, the high-refractive index layer is formed of, for example, $Ta_2O_5$, and the number of times of stacking can be 10 pairs. The first reflection mirror 303 is provided at a position facing the current injection region via other layers in the Z direction.

The buffer layer 102, the first intermediate layer 104, the light-emitting layer 105, the second intermediate layer 106, the tunnel junction layer 107, the third intermediate layer 108, the second reflection mirror 109, the second electrode 111, and the insulation layer 112 have configurations similar to those in the first embodiment. Note that the second reflection mirror 109 may be formed in a lens shape that collects light on the current injection region, the lens shape having a recessed surface, similarly to the first reflection mirror 303. Further, only the second reflection mirror 109 may have a lens shape and the first reflection mirror 303 does not necessarily need to have a lens shape.

The first electrode 310 is provided on the second intermediate layer 106 and functions as one electrode of the VCSEL device 300. The first electrode 310 can have an annular shape surrounding the mesa structure M and can be formed of, for example, Ti/Pt/Au.

The metal layer 313 is formed of a metal, is provided on the back surface of the substrate 301, and covers the first reflection mirror 303. The metal layer 313 has a curved surface having a lens shape in accordance with the shape of the first reflection mirror 303.

The VCSEL device 300 has the configuration as described above. Note that the thickness of the first intermediate layer 104 is suitably 5λ in an optical film thickness. Further, the first conductivity type and the second conductivity type in the VCSEL device 300 may be reversed, i.e., the first conductivity type may be the p-type and the second conductivity type may be the n-type.

The mesa structure M of the VCSEL device 300 has the same configuration as that of the VCSEL device 100, and is configured such that the end surface P of the tunnel junction layer 107 is spaced apart from the side surface S of the mesa structure M (see FIG. 4).

Also the operation of the VCSEL device 300 is similar to that of the VCSEL device 100. When a voltage is applied between the first electrode 310 and the second electrode 111, the current injection region R (see FIG. 6) is formed by the current confinement structure of the tunnel junction layer 107. The spontaneous emission light causes laser oscillation by the first reflection mirror 303 and the second reflection mirror 109, and a laser beam is emitted passing through the second reflection mirror 109.

In this configuration, since the thickness of the first substrate 301 is increased, heat dissipation is further improved. Further, since a lens structure is formed in the first reflection mirror 303 and the metal layer 313, light emitted from the light-emitting layer 105 is collected in the current injection region R of the light-emitting layer 105 by this lens structure, and an optical confinement effect can be achieved. As a result, it is possible to prevent the light emission efficiency from decreasing even in the case where the thickness of the first substrate 301 is increased.

[Method of Producing VCSEL Device]

A method of producing the VCSEL device 300 will be described. FIG. 20 to FIG. 23 are each a schematic diagram showing a method of producing the VCSEL device 100.

Figure 20:
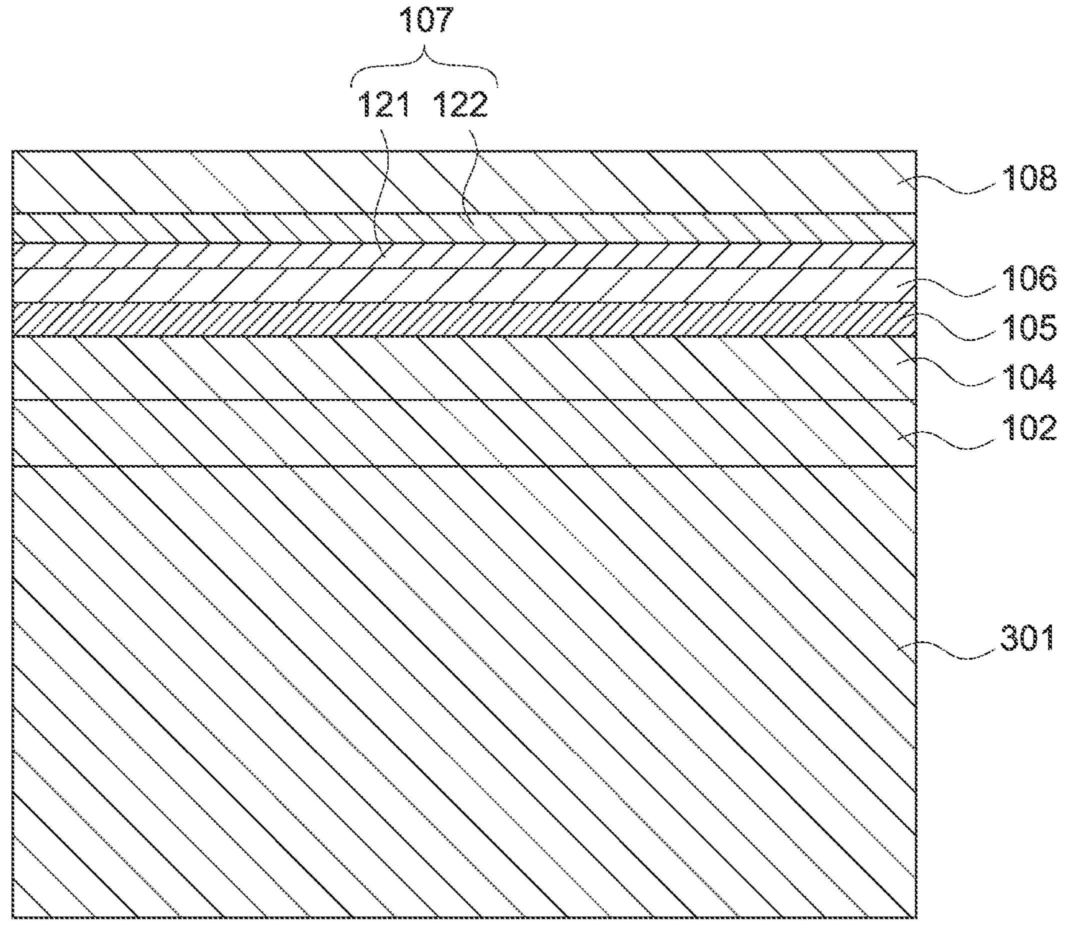
FIG. 20 is a schematic diagram showing a method of producing the VCSEL device.
Figure 20:
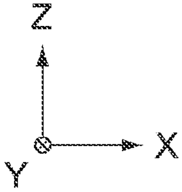

First, as shown in FIG. 20, the buffer layer 102, the first intermediate layer 104, the light-emitting layer 105, the second intermediate layer 106, the tunnel junction layer 107, and the third intermediate layer 108 are stacked on the substrate 301 in this order to form a stacked body. These layers can be stacked by a MOCVD method, and doping of a dopant can be performed simultaneously with the stacking.

Figure 21:
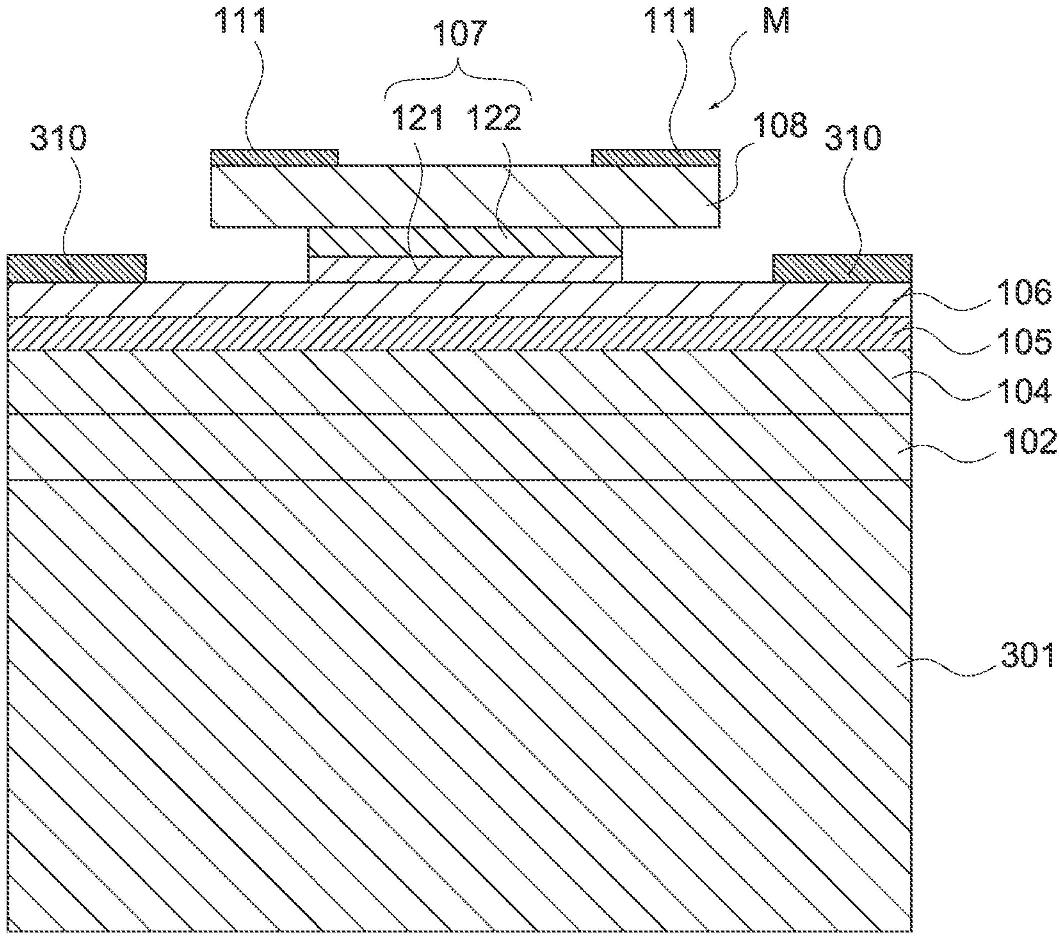
FIG. 21 is a schematic diagram showing the method of producing the VCSEL device.
Figure 21:
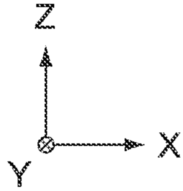

Next, as shown in FIG. 21, the second electrode 111 is formed on the third intermediate layer 108 and then, part of the third intermediate layer 108 and the tunnel junction layer 107 is removed. This process can be performed in a way similar to that in the first embodiment. As a result, the mesa structure M is formed and the tunnel junction layer 107 is side-etched. Further, the first electrode 310 is formed on the second intermediate layer 106.

Figure 22:
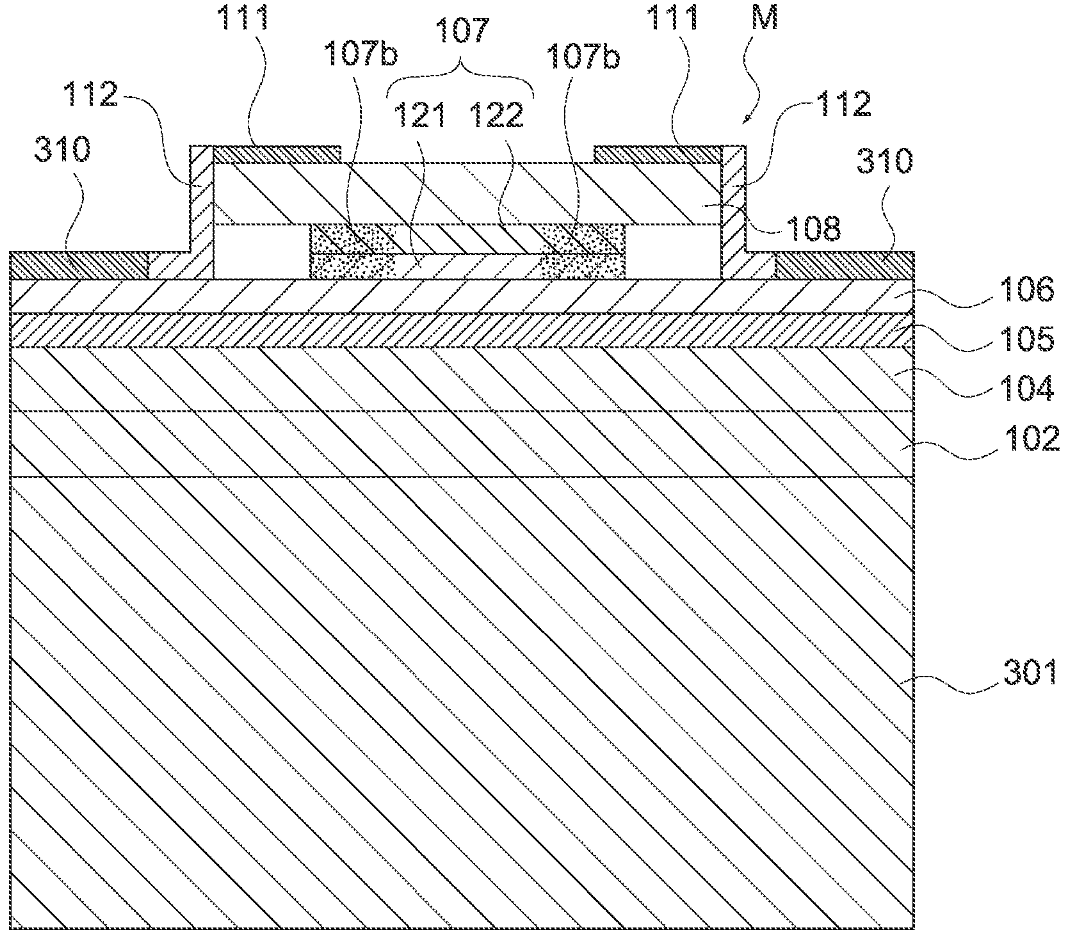
FIG. 22 is a schematic diagram showing the method of producing the VCSEL device.
Figure 22:
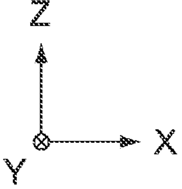

Subsequently, as shown in FIG. 22, the tunnel junction layer 107 is oxidized from the outer periphery side to generate an Al oxide in the outer peripheral region 107*b* and the insulation layer 112 is formed on the second intermediate layer 106 and on the side surface S of the mesa structure M, similarly to the first embodiment. Further, the second reflection mirror 109 is formed on the opening 111*a*.

Figure 23:
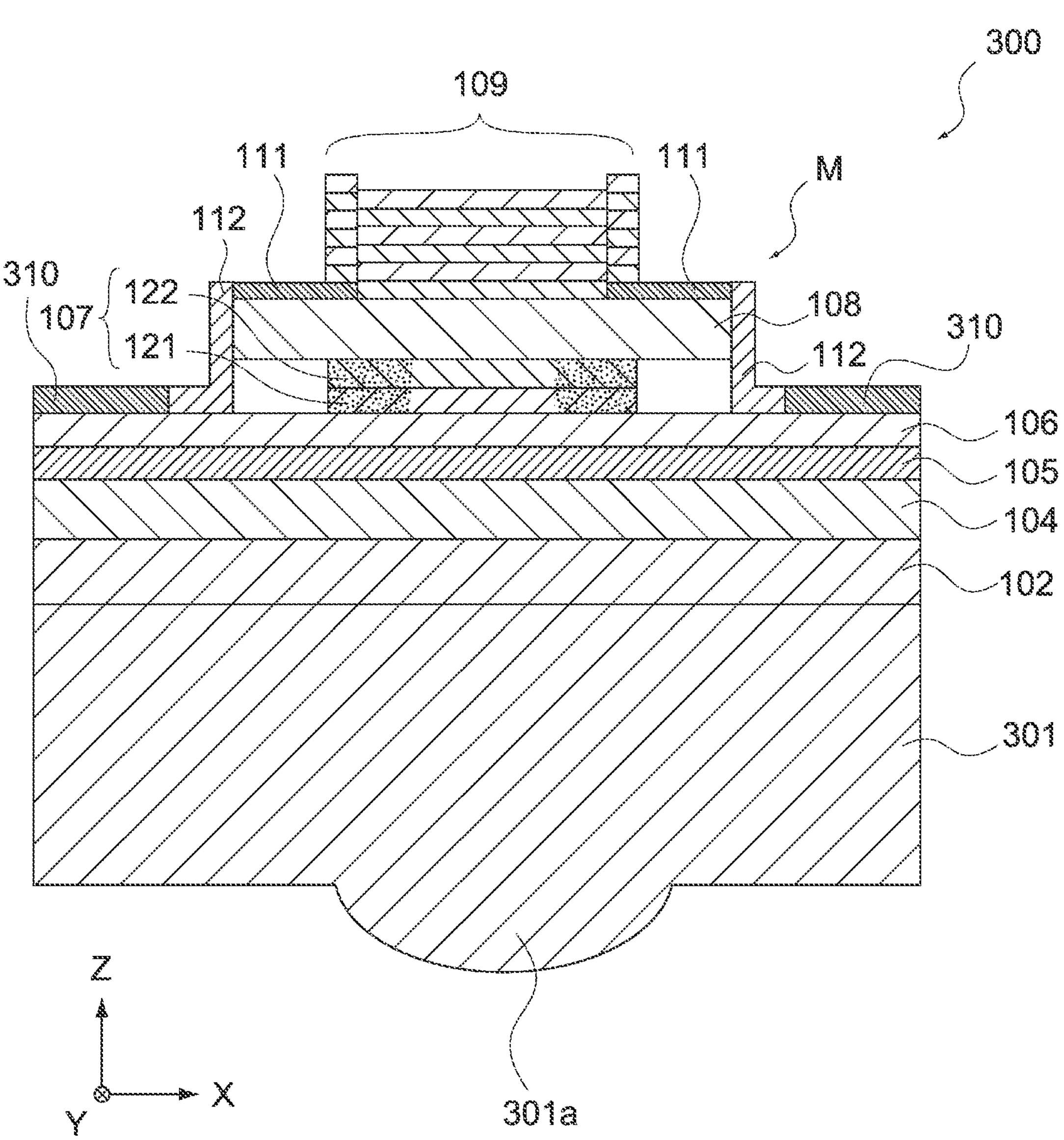
FIG. 23 is a schematic diagram showing the method of producing the VCSEL device.

Subsequently, as shown in FIG. 23, the thickness of the substrate 301 is reduced to form the projecting portion 301*a*. The thickness of the substrate 301 can be reduced by attaching the surface of the stacked body to a support substrate with wax or the like and then performing etching. The thickness of the substrate 301 can be, for example, 100 μm.

The projecting portion 301*a* can be formed by forming a columnar resist on the back surface of the substrate 301 by photolithography, heating it to ball up, and then, performing etching with dry etching to transfer the recessed surface shape of the resist to the substrate 301. The radius of curvature of the projecting portion 301*a* can be, for example, approximately 100 μm.

Further, the first reflection mirror 303 (see FIG. 19) is formed on the back surface of the substrate 301. The first reflection mirror 303 can be formed by uniformly stacking a low-refractive index layer and a high-refractive index layer to obtain a plurality of layers and then removing part thereof except for the vicinity of the current injection region. Subsequently, the metal layer 313 (see FIG. 19) is formed on the back surface of the substrate 301.

After that, the support substrate is removed, and the obtained product can be divided into pieces for each device to produce the VCSEL device 300. The VCSEL device 300 can be caused to operate by being mounted on a heat sink or the like and electrically connected by wire bonding or the like.

Since the tunnel junction layer 107 is side-etched also in the VCSEL device 300 similarly to the first embodiment, it is possible to complete oxidation in a short time even in the case where the tunnel junction layer 107 is formed of AlInAs. Therefore, it is possible to produce the VCSEL device 300 having a current confinement structure by a producible method.

Fourth Embodiment

A VCSEL device according to a fourth embodiment of the present technology will be described.

[Structure of VCSEL Device]

Figure 24:
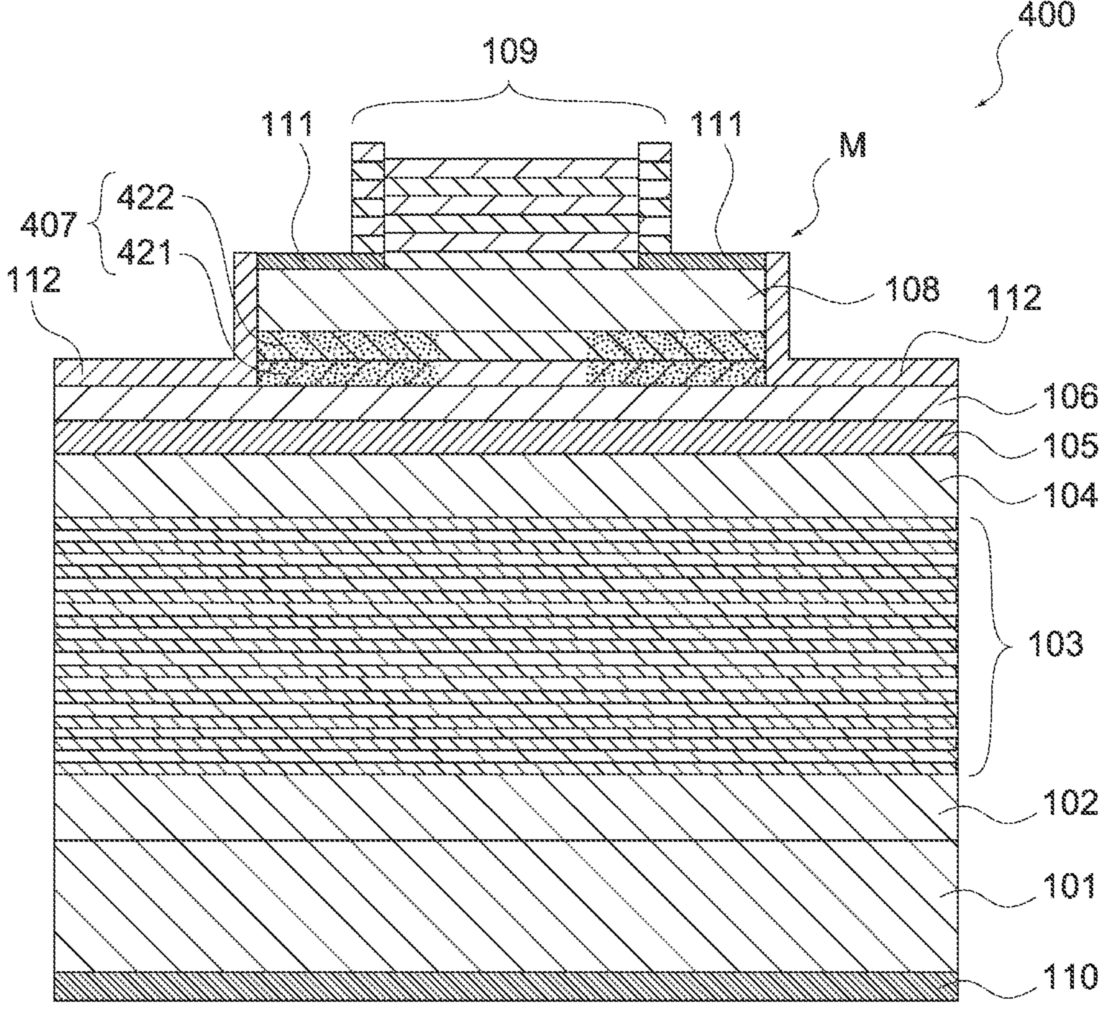
FIG. 24 is a cross-sectional view of a VCSEL device according to a fourth embodiment of the present technology.
Figure 24:
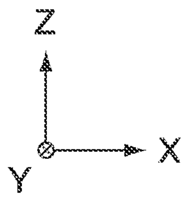

FIG. 24 is a cross-sectional view of a VCSEL device 400 according to this embodiment. Note that the same configurations of the VCSEL device 400 according to this embodiment as those of the VCSEL device 100 according to the first embodiment will be denoted by the same reference symbols as those of the VCSEL device 100, and description thereof will be omitted.

As shown in FIG. 24, the VCSEL device 400 includes the substrate 101, the buffer layer 102, the first reflection mirror 103, the first intermediate layer 104, the light-emitting layer 105, the second intermediate layer 106, a tunnel junction layer 407, the third intermediate layer 108, the second reflection mirror 109, the first electrode 110, the second electrode 111, and the insulation layer 112.

The substrate 101, the buffer layer 102, the first reflection mirror 103, the first intermediate layer 104, the light-emitting layer 105, the second intermediate layer 106, the tunnel junction layer 107, the third intermediate layer 108, the second reflection mirror 109, the first electrode 110, the second electrode 111, and the insulation layer 112 have configurations similar to those in the first embodiment.

Here, the material of each layer can be different from that in the first embodiment, and the substrate 101 can be formed of, for example, n-type GaAs. Other layers are each formed a material that can be lattice-matched with the substrate 101. The buffer layer 102 can be formed of, for example, n-GaAs, the first intermediate layer 104 can be formed of, for example, n-GaAs, the second intermediate layer 106 can be formed of, for example, p-GaAs, and the third intermediate layer 108 can be formed of, for example, n-GaAs.

Further, the first reflection mirror 103 can be a semiconductor DBR formed of an n-type semiconductor material. The low-refractive index layer can be formed of, for example, n-AlAs and the high-refractive index layer can be formed of, for example, n-GaAs. The number of times of stacking can be, for example, 40 pairs. The second reflection mirror 109 can be a semiconductor DBR formed of an n-type semiconductor material. The low-refractive index layer can be formed of, for example, n-AlAs and the high-refractive index layer can be formed of, for example, n-GaAs. The number of times of stacking can be formed of, for example, 30 pairs. Note that one or both of the first reflection mirror 103 and the second reflection mirror 109 may be a dielectric DBR.

The light-emitting layer 105 can be a layer having a multiple quantum well structure in which a quantum well layer and a barrier layer are alternately stacked. The quantum well layer can be formed of, for example, GaInAs, and the barrier layer can be formed of, for example, AlGaAs. The emission wavelength of the light-emitting layer 105 can be 940 nm, and the number of wells can be four.

Figure 25:
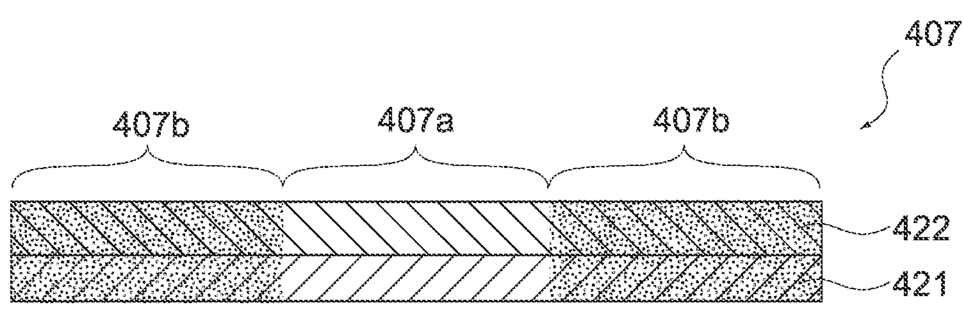
FIG. 25 is a cross-sectional view of a tunnel junction layer included in the VCSEL device.
Figure 25:
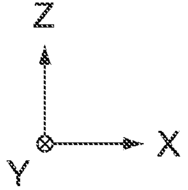
Figure 26:
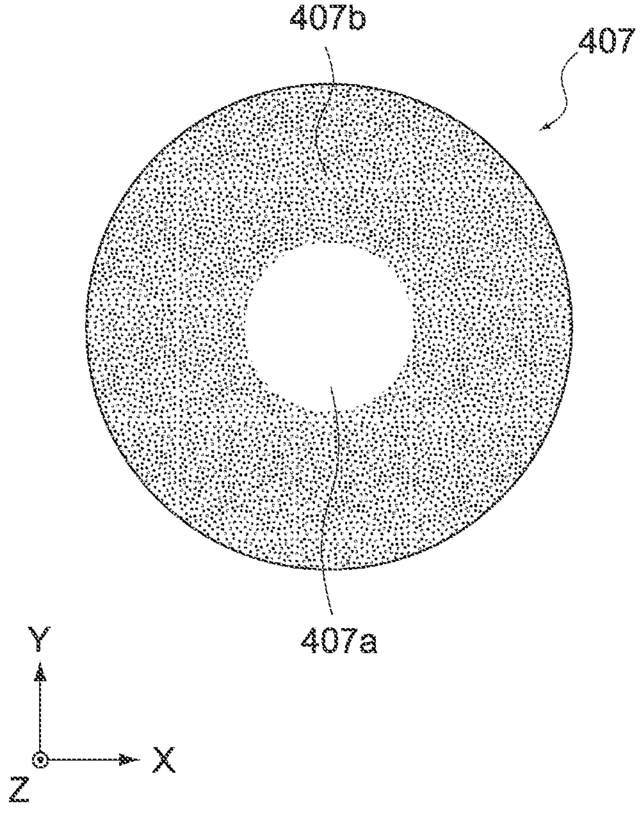
FIG. 26 is a cross-sectional view of the tunnel junction layer included in the VCSEL device.

The tunnel junction layer 407 is provided on the second intermediate layer 106 to form a tunnel junction. FIG. 25 is a cross-sectional view of the tunnel junction layer 407. FIG. 26 is a plan view of the tunnel junction layer 407 and is a diagram of the tunnel junction layer 407 when viewed from the Z direction.

As shown in FIG. 25, the tunnel junction layer 407 includes a first highly doped layer 421 and a second highly doped layer 422. The first highly doped layer 421 is a layer on the side of the second intermediate layer 106, and the second highly doped layer 422 is formed on a layer on the side of the third intermediate layer 108.

As shown in FIG. 26, the tunnel junction layer 407 has an inner peripheral region 407*a* and an outer peripheral region 407*b*. The inner peripheral region 407*a* is a region located on the inner peripheral side of the tunnel junction layer 407, and the outer peripheral region 407*b* is an annular region surrounding the inner peripheral region 407*a*.

The inner peripheral region 407*a* of the first highly doped layer 421 is formed of a highly doped p-type semiconductor material containing Al, and can be formed of, for example, $p^+$-AlAs. The inner peripheral region 407*a* of the second highly doped layer 422 is formed of a highly doped n-type semiconductor material containing Al, and can be formed of, for example, $n^+$-AlAs.

The outer peripheral region 407*b* of each of the first highly doped layer 421 and the second highly doped layer 422 is formed of a material obtained by oxidizing the material of the inner peripheral region 407*a* and has insulating properties. That is, the outer peripheral region 407*b* of each of the first highly doped layer 421 and the second highly doped layer 422 contains an Al oxide and can be formed of, for example, an AlAs oxide. The thickness of each of the first highly doped layer 421 and the second highly doped layer 422 can be 20 nm. Further, the distance between the tunnel junction layer 407 and the light-emitting layer 105 is suitably λ/4.

The VCSEL device 400 has the structure as described above. As described above, the substrate 101, the buffer layer 102, the first reflection mirror 103, the first intermediate layer 104, the third intermediate layer 108, and the second highly doped layer 422 are each formed of an n-type semiconductor material as a first conductivity type, and the dopant can be Si. The second intermediate layer 106 and the first highly doped layer 421 are each formed of a p-type semiconductor material as a second conductivity type, and the dopant of the second intermediate layer 106 can be Mg. Further, the dopant of the first highly doped layer 421 is suitably C that is difficult to diffuse.

The doping concentration can be, for example, 5×19 [$cm^{-3}$] for the first highly doped layer 421 and the second highly doped layer 422 and approximately $5\times10^{17}$ to $1\times10^{18}$ [$cm^{-3}$] for the other layers. Note that the first conductivity type and the second conductivity type in the VCSEL device 400 may be reversed, i.e., the first conductivity type may be the p-type and the second conductivity type may be the n-type.

[Regarding Mesa Structure]

Figure 27:
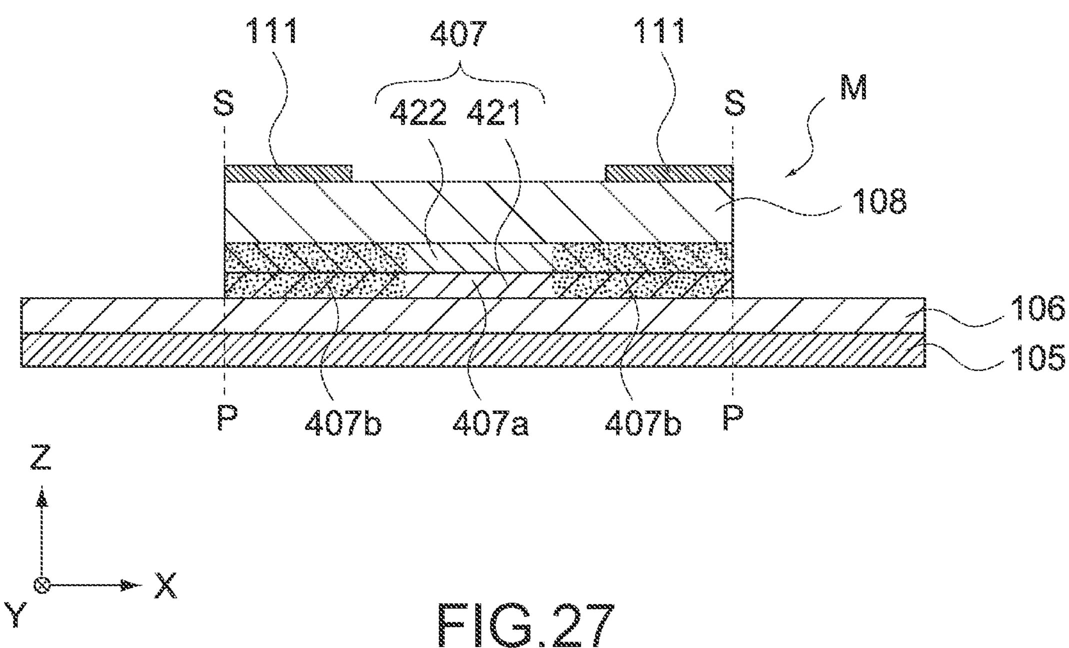
FIG. 27 is a cross-sectional view of part of the VCSEL device.
Figure 28:
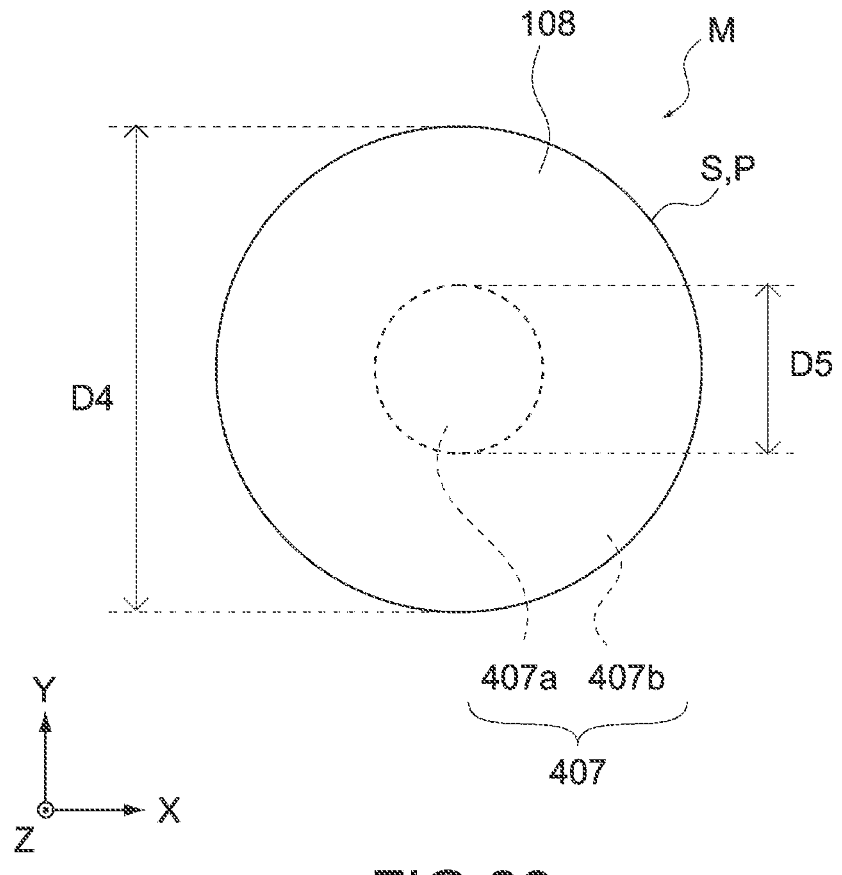
FIG. 28 is a plan view of a mesa structure of the VCSEL device.

The VCSEL device 400 has a mesa structure. FIG. 27 is a cross-sectional view showing a partial configuration of the VCSEL device 400, including the mesa structure. FIG. 28 is plan view of the mesa structure and is a diagram of the mesa structure when viewed from the Z direction.

As shown in these figures, the tunnel junction layer 407 and the third intermediate layer 108 are formed in a mesa shape to form the mesa structure M. As shown in FIG. 28, the mesa structure M can have a circular shape when viewed from the Z direction. The mesa structure M is formed such that the inner peripheral region 407*a* of the tunnel junction layer 407 is located at the center of the mesa structure M and includes a current injection region.

As shown in FIG. 27 and FIG. 28, the side surface of the mesa structure M is referred to as the side surface S. The side surface S is the outer peripheral surface of the mesa structure M along the Z direction and can be a cylindrical surface. Further, the end surface of the tunnel junction layer 407 can be referred to as the end surface P. The end surface P is the outer peripheral surface of the outer peripheral region 407*b* along the Z direction and can be a cylindrical surface. As shown in FIG. 27, the outer peripheral region 407*b* is formed to a certain depth in the X-Y direction from the end surface P, and the inner peripheral region 407*a* is spaced apart from the end surface P by the outer peripheral region 407*b*.

In this embodiment, the outer diameter of the tunnel junction layer 407 corresponds to the outer diameter of the third intermediate layer 108. For this reason, the end surface P is located on the same surface as the side surface S. An outer diameter D4 of the mesa structure M can be, for example, 100 μm. Further, an outer diameter D5 of the inner peripheral region 407*a* can be, for example, 8 μm.

The mesa structure M is formed as described above. Note that the mesa structure M is not limited to the one including only the tunnel junction layer 407 and the third intermediate layer 108 and may be, for example, one including the second intermediate layer 106 in addition thereto. In this case, the end surfaces of the third intermediate layer 108 and the second intermediate layer 106 are located on the same surface as the side surface S. Further, the mesa structure M may be one including the light-emitting layer 105, or one including the light-emitting layer 105 and the first intermediate layer 104. In each of the cases, the end surface P can be located on the same surface as the side surface S.

Also the operation of the VCSEL device 400 is similar to that of the VCSEL device 100. When a voltage is applied between the first electrode 110 and the second electrode 111, the current injection region R (see FIG. 6) is formed by the current confinement structure of the tunnel junction layer 407. The spontaneous emission light causes laser oscillation by the first reflection mirror 103 and the second reflection mirror 109, and a laser beam is emitted passing through the second reflection mirror 109.

[Method of Producing VCSEL Device]

Figure 29:
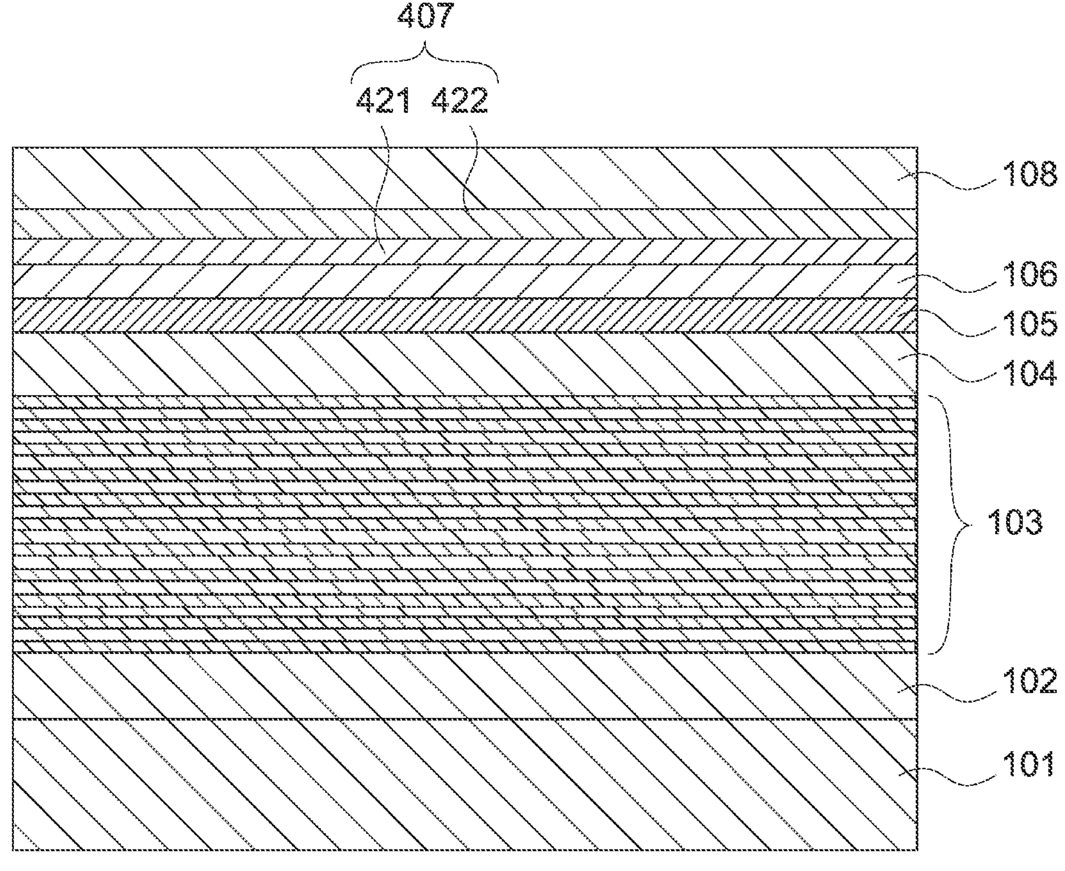
FIG. 29 is a schematic diagram showing a method of producing the VCSEL device.
Figure 29:
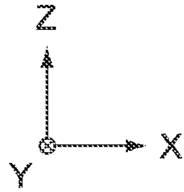

A method of producing the VCSEL device 400 will be described. FIG. 29 to FIG. 32 are each a schematic diagram showing a method of producing the VCSEL device 100. First, as shown in FIG. 29, the buffer layer 102, the first reflection mirror 103, the first intermediate layer 104, the light-emitting layer 105, the second intermediate layer 106, the tunnel junction layer 407, and the third intermediate layer 108 are stacked on the substrate 101 in this order to form a stacked body. These layers can be stacked by a MOCVD method, and doping of a dopant can be performed simultaneously with the stacking.

Figure 30:
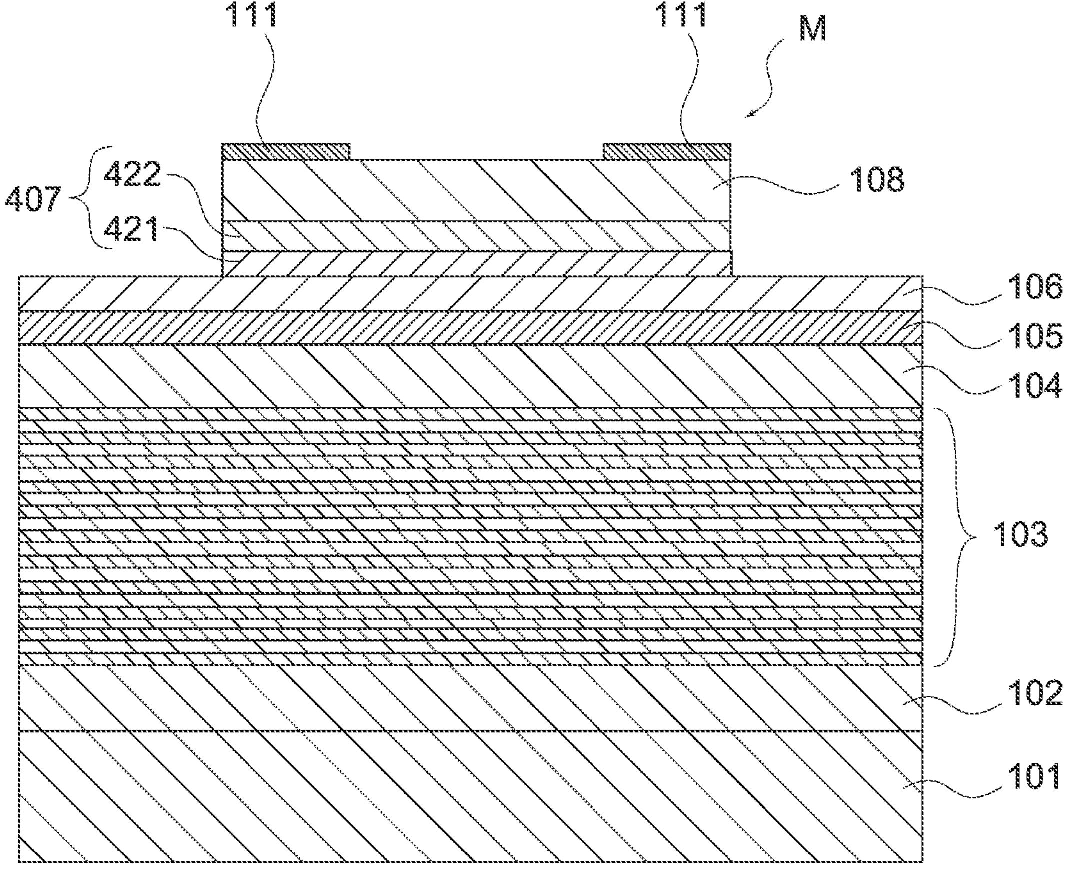
FIG. 30 is a schematic diagram showing the method of producing the VCSEL device.
Figure 30:
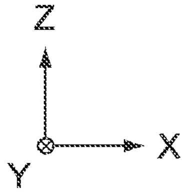

Next, as shown in FIG. 30, the second electrode 111 is formed on the third intermediate layer 108. The second electrode 111 can have an annular shape having an inner diameter of 10 μm and an outer diameter of 100 μm. After that, part of the third intermediate layer 108 and the tunnel junction layer 407 is removed in accordance with the outer diameter of the second electrode 111. The removal of third intermediate layer 108 and the tunnel junction layer 407 can be performed with dry etching.

The removal of the third intermediate layer 108 and the tunnel junction layer 407 forms the mesa structure M. In this this embodiment, the tunnel junction layer 407 is not side-etched, and the end surface P of the tunnel junction layer 407 is located on the same surface as the side surface S of the mesa structure M.

Figure 31:
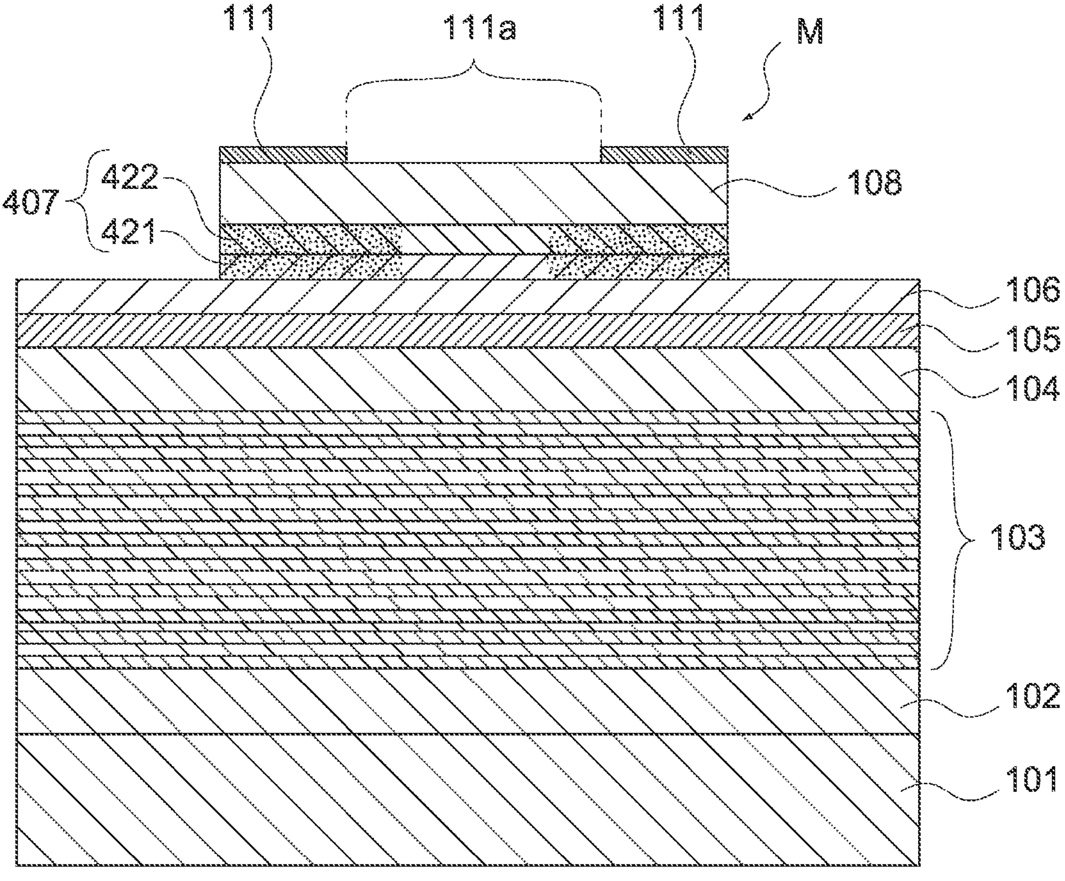
FIG. 31 is a schematic diagram showing the method of producing the VCSEL device.
Figure 31:
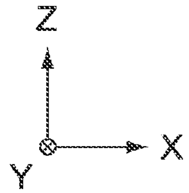

Subsequently, as shown in FIG. 31, the tunnel junction layer 407 is selectively oxidized from the outer periphery side. As a result, the constituent material of the tunnel junction layer 407 is oxidized in the outer peripheral region 407*b*, and an Al oxide is generated in the outer peripheral region 407*b*. The inner peripheral region 407*a* is not oxidized because it is spaced apart from the end surface P, and is maintained as the material containing Al. This oxidation can be performed by placing a stacked body in an oxidation furnace and heating it to 400° C. to 450° C. in a steam atmosphere.

Since oxidation selectively proceeds in a layer having a high Al composition, only the tunnel junction layer 407 can be oxidized by increasing the Al composition of the tunnel junction layer 407. Further, in the case where the tunnel junction layer 407 is formed of AlAs, it is possible to complete the oxidation in a short time because the oxidation rate of AlAs is high.

Specifically, as shown in FIG. 31, the outer peripheral region 407*b* can be formed by oxidizing the tunnel junction layer 407 to the inside by 1 μm than the opening 111*a* of the second electrode 111. In the case where the diameter of the opening 111*a* is 10 μm, the outer diameter D5 (see FIG. 28) of the inner peripheral region 407*a* is 8 μm.

Figure 32:
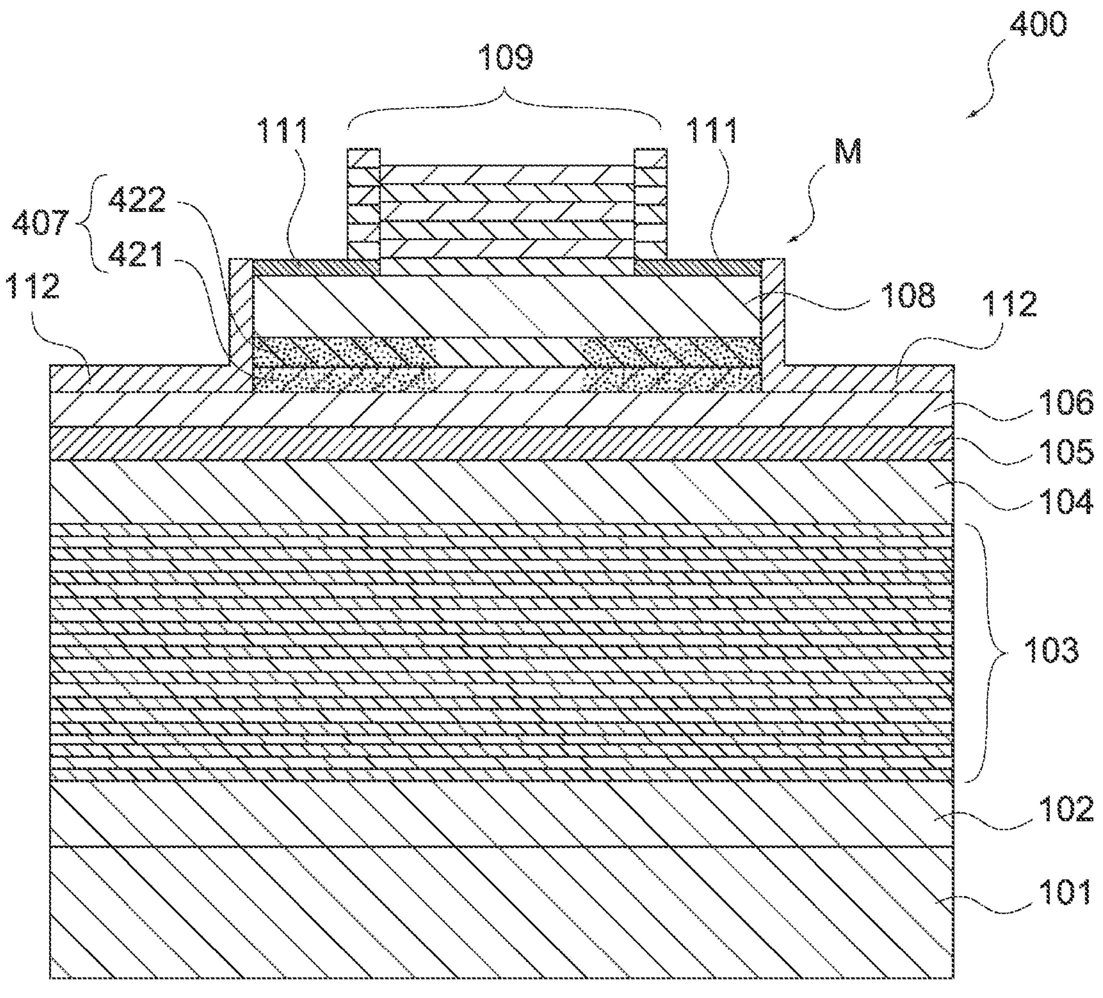
FIG. 32 is a schematic diagram showing the method of producing the VCSEL device.
Figure 32:
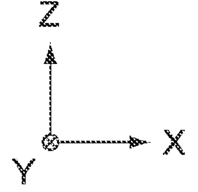

Subsequently, as shown in FIG. 32, the insulation layer 112 is formed on the second intermediate layer 106 and on the side surface S of the mesa structure M, and the second reflection mirror 109 is formed on the opening 111*a*. The second reflection mirror 109 can be formed by uniformly stacking a low-refractive index layer and a high-refractive index layer to obtain a plurality of layers and then removing part thereof except for the vicinity of the opening 111*a*.

Subsequently, the first electrode 110 (see FIG. 24) is formed of the substrate 101, and the obtained product is divided into pieces for each device to produce the VCSEL device 400. The VCSEL device 400 can be caused to operate by being mounted on a heat sink or the like and electrically connected by wire bonding or the like.

The VCSEL device 400 can be produced as described above. In this embodiment, although the tunnel junction layer 407 is not side-etched, it is possible to complete oxidation in a short time by forming the tunnel junction layer 407 of AlAs whose oxidation rate is high. Therefore, it is possible to produce the VCSEL device 400 having a current confinement structure by a producible method.

(Regarding Present Disclosure)

The effects described in the present disclosure are merely examples and are not limited, and additional effects may be exerted. The description of the plurality of effects described above does not necessarily mean that these effects are exhibited simultaneously. It means that at least one of the effects described above can be achieved in accordance with conditions or the like, and there is a possibility that an effect that is not described in the present disclosure is exerted. Further, at least two feature portions of the feature portions described in the present disclosure may be combined.

It should be noted that the present technology may also take the following configurations.

(1) A vertical cavity surface emitting laser device, including:

- a first reflection mirror that reflects light of a specific wavelength;
- a second reflection mirror that reflects light of the wavelength;
- a first semiconductor layer that is disposed between the first reflection mirror and the second reflection mirror and is formed of a semiconductor material having a first conductivity type;

a second semiconductor layer that is disposed between the first reflection mirror and the second reflection mirror and is formed of a semiconductor material having a second conductivity type;

a tunnel junction layer that is disposed between the first reflection mirror and the second reflection mirror, a highly doped layer of the first conductivity type and a highly doped layer of the second conductivity type being joined together in the tunnel junction layer, the tunnel junction layer having an inner peripheral region on an inner peripheral side when viewed from a direction perpendicular to a layer surface and an outer peripheral region surrounding the inner peripheral region, the inner peripheral region being formed of a material containing Al, the outer peripheral region being formed of a material containing an Al oxide; and a light-emitting layer that is disposed between the first reflection mirror and the second reflection mirror and emits light by carrier recombination, the vertical cavity surface emitting laser device having a mesa structure that has a current injection region where a current passing through the inner peripheral region and flowing into the light-emitting layer concentrates.

(2) The vertical cavity surface emitting laser device according to (1) above, in which the tunnel junction layer has an end surface that is an outer peripheral surface along the direction of the outer peripheral region, the mesa structure has a side surface that is an outer peripheral surface along the direction, and the end surface is located on a side of the inner peripheral region than the side surface and is spaced apart from the side surface.

(3) The vertical cavity surface emitting laser device according to (2) above, in which a gap is provided between the end surface and the side surface.

(4) The vertical cavity surface emitting laser device according to (2) above, in which a space between the end surface and the side surface is filled with an insulator.

(5) The vertical cavity surface emitting laser device according to (3) or (4) above, in which the inner peripheral region is formed of AlInAs, and the outer peripheral region is formed of an oxide of AlInAs.

(6) The vertical cavity surface emitting laser device according to (5) above, in which the light-emitting layer has a multiple quantum well structure formed of AlGaInAs.

(7) The vertical cavity surface emitting laser device according to (1) above, in which the tunnel junction layer has an end surface that is an outer peripheral surface along the direction of the outer peripheral region, the mesa structure has a side surface that is an outer peripheral surface along the direction, and the end surface is located on the same surface as the side surface.

(8) The vertical cavity surface emitting laser device according to (7) above, in which the inner peripheral region is formed of AlAs, and the outer peripheral region is formed of an AlAs oxide.

(9) The vertical cavity surface emitting laser device according to (8) above, in which the light-emitting layer has a multiple quantum well structure formed of AlGaAs and GaInAs.

(10) The vertical cavity surface emitting laser device according to any one of (1) to (9), in which at least one of the first reflection mirror or the second reflection mirror is formed of a dielectric.

(11) The vertical cavity surface emitting laser device according to (10) above, in which both the first reflection mirror and the second reflection mirror are formed of a dielectric.

(12) The vertical cavity surface emitting laser device according to any one of (1) to (11) above, in which at least one of the first reflection mirror or the second reflection mirror has a lens shape that collects light on the current injection region.

(13) A method of producing a vertical cavity surface emitting laser device, including:

preparing a stacked body that includes a first semiconductor layer formed of a semiconductor material having a first conductivity type, a second semiconductor layer formed of a semiconductor material having a second conductivity type, a tunnel junction layer formed of a material containing Al, a highly doped layer of the first conductivity type and a highly doped layer of the second conductivity type being joined together in the tunnel junction layer, and a light-emitting layer that emits light by carrier recombination;

forming a mesa structure having a current injection region where a current flowing into the light-emitting layer concentrates; and selectively oxidizing the tunnel junction layer from a side of an outer periphery of the mesa structure to form, in the tunnel junction layer, an inner peripheral region on an inner peripheral side and an outer peripheral region surrounding the inner peripheral region, the inner peripheral region being formed of a material containing Al, the outer peripheral region being formed of a material containing an Al oxide.

(14) The method of producing a vertical cavity surface emitting laser device according to (13) above, further including a step of removing, after the step of forming the mesa structure and before the step of oxidizing the tunnel junction layer, part of the tunnel junction layer from a side of an outer periphery of the tunnel junction layer to cause an end surface of the tunnel junction layer to be spaced apart from a side surface of the mesa structure.

(15) The method of producing a vertical cavity surface emitting laser device according to (14) above, in which the step of removing part of the tunnel junction layer is a wet etching step using an etchant for selectively etching the tunnel junction layer.

REFERENCE SIGNS LIST

100, 200, 300, 400 VCSEL device
101, 201, 301 substrate
102 buffer layer
103, 203, 303 first reflection mirror
104 first intermediate layer
105 light-emitting layer
106 second intermediate layer
107, 407 tunnel junction layer
107*a*, 407*a* inner peripheral region
107*b*, 407*b* outer peripheral region
108 third intermediate layer
109 second reflection mirror
110, 210, 310 first electrode

111 second electrode
112 insulation layer
121, 412 first highly doped layer
122, 422 second highly doped layer
313 metal layer

The invention claimed is:

1. A vertical cavity surface emitting laser device, comprising:

a first reflection mirror configured to reflect light of a specific wavelength;

a second reflection mirror configured to reflect the light of the specific wavelength;

a first semiconductor layer between the first reflection mirror and the second reflection mirror, wherein the first semiconductor layer includes a semiconductor material having a first conductivity type;

a second semiconductor layer between the first reflection mirror and the second reflection mirror, wherein the second semiconductor layer includes a semiconductor material having a second conductivity type;

a tunnel junction layer between the first reflection mirror and the second reflection mirror, wherein the tunnel junction layer includes a first doped layer of the first conductivity type and a second doped layer of the second conductivity type, the first doped layer is joined with the second doped layer in the tunnel junction layer, each of the first doped layer and the second doped layer has a doping concentration higher than that of the first semiconductor layer and the second semiconductor layer, each of the first doped layer and the second doped layer includes:

an inner peripheral region on an inner peripheral side of the tunnel junction layer when viewed from a direction perpendicular to a layer surface of the tunnel junction layer, and an outer peripheral region surrounding the inner peripheral region, the inner peripheral region of the each of the first doped layer and the second doped layer includes Al, and the outer peripheral region of the each of the first doped layer and the second doped layer includes an Al oxide; and a light-emitting layer between the first reflection mirror and the second reflection mirror, wherein the light-emitting layer is configured to emit the light by carrier recombination, and the vertical cavity surface emitting laser device has a mesa structure that has a current injection region where a current that passes through the inner peripheral region and flows into the light-emitting layer concentrates.

2. The vertical cavity surface emitting laser device according to claim 1, wherein the tunnel junction layer has an end surface that is an outer peripheral surface along the direction, the mesa structure has a side surface that is an outer peripheral surface along the direction, the end surface is located closer to the inner peripheral region than the side surface, and the end surface is spaced apart from the side surface.

3. The vertical cavity surface emitting laser device according to claim 2, wherein a gap is between the end surface and the side surface.

4. The vertical cavity surface emitting laser device according to claim 2, further comprising an insulator in a space between the end surface and the side surface.

5. The vertical cavity surface emitting laser device according to claim 3, wherein the inner peripheral region includes AlInAs, and the outer peripheral region includes an oxide of AlInAs.

6. The vertical cavity surface emitting laser device according to claim 5, wherein the light-emitting layer has a multiple quantum well structure that includes AlGaInAs.

7. The vertical cavity surface emitting laser device according to claim 1, wherein the tunnel junction layer has an end surface that is an outer peripheral surface along the direction, the mesa structure has a side surface that is an outer peripheral surface along the direction, and the end surface is located on the same surface as the side surface.

8. The vertical cavity surface emitting laser device according to claim 7, wherein the inner peripheral region includes AlAs, and the outer peripheral region includes an AlAs oxide.

9. The vertical cavity surface emitting laser device according to claim 8, wherein the light-emitting layer has a multiple quantum well structure that includes of AlGaAs and GaInAs.

10. The vertical cavity surface emitting laser device according to claim 1, wherein at least one of the first reflection mirror or the second reflection mirror includes-is formed of a dielectric.

11. The vertical cavity surface emitting laser device according to claim 10, wherein both the first reflection mirror and the second reflection mirror include the dielectric.

12. The vertical cavity surface emitting laser device according to claim 1, wherein at least one of the first reflection mirror or the second reflection mirror has a lens shape configured to collect the light on the current injection region.

13. A method of producing a vertical cavity surface emitting laser device, the method comprising:

preparing a stacked body that includes:

a first semiconductor layer including a semiconductor material having a first conductivity type, a second semiconductor layer including a semiconductor material having a second conductivity type, a tunnel junction layer including a first doped layer of the first conductivity type and a second doped layer of the second conductivity type, wherein the first doped layer is joined with the second doped layer in the tunnel junction layer, and each of the first doped layer and the second doped layer has a doping concentration higher than that of the first semiconductor layer and the second semiconductor layer, and a light-emitting layer that emits light by carrier recombination;

forming a mesa structure having a current injection region where a current flowing into the light-emitting layer concentrates; and selectively oxidizing the tunnel junction layer from a side of an outer periphery of the mesa structure to form, in each of the first doped layer and the second doped layer, an inner peripheral region on an inner peripheral side of the tunnel junction layer and an outer peripheral region surrounding the inner peripheral region, wherein the inner peripheral region of the each of the first doped layer and the second doped layer includes Al, and the outer peripheral region of the each of the first doped layer and the second doped layer includes an Al oxide.

14. The method of producing the vertical cavity surface emitting laser device according to claim 13, the method further comprising removing, after the forming of the mesa structure and before the oxidizing of the tunnel junction layer, a part of the tunnel junction layer from a side of an outer periphery of the tunnel junction layer to cause an end surface of the tunnel junction layer to be spaced apart from a side surface of the mesa structure.

15. The method of producing the vertical cavity surface emitting laser device according to claim 14, wherein the removing of the part of the tunnel junction layer comprises wet etching using an etchant for selectively etching the tunnel junction layer.

* * * * *